(12) United States Patent
Baldwin et al.

(10) Patent No.: US 9,054,214 B1
(45) Date of Patent: Jun. 9, 2015

(54) METHODOLOGY OF FORMING CMOS GATES ON THE SECONDARY AXIS USING DOUBLE-PATTERNING TECHNIQUE

(71) Applicant: Texas Instruments Incorporated, Dallas, TX (US)

(72) Inventors: Gregory Charles Baldwin, Plano, TX (US); Scott William Jessen, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/563,266

(22) Filed: Dec. 8, 2014

Related U.S. Application Data

(60) Provisional application No. 61/915,102, filed on Dec. 12, 2013.

(51) Int. Cl.
*H01L 21/8238* (2006.01)
*H01L 21/8234* (2006.01)
*H01L 21/033* (2006.01)

(52) U.S. Cl.
CPC ... *H01L 21/823456* (2013.01); *H01L 21/823462* (2013.01); *H01L 21/823412* (2013.01); *H01L 21/0332* (2013.01); *H01L 21/0335* (2013.01); *H01L 21/0337* (2013.01); *H01L 21/0338* (2013.01)

(58) Field of Classification Search
CPC ... H01L 29/78; H01L 29/66477; H01L 27/92; H01L 21/823857; H01L 21/823807; H01L 21/336; H01L 21/338; G03F 1/144; G03F 1/36; G03F 1/0061; G03F 1/30
USPC ........ 438/286, 197, 382, 217; 430/5, 30, 394, 430/313, 314, 316
See application file for complete search history.

(56) References Cited

U.S. PATENT DOCUMENTS

| | | | |
|---|---|---|---|
| 6,465,307 B1 * | 10/2002 | Chidambaram et al. ....... | 438/286 |
| 7,984,393 B2 * | 7/2011 | Aton et al. ..................... | 716/54 |
| 8,373,441 B1 * | 2/2013 | Milinichik et al. ........... | 326/101 |
| 2014/0252485 A1 * | 9/2014 | Hao et al. ...................... | 257/365 |
| 2014/0284725 A1 * | 9/2014 | McMullan et al. ........... | 257/382 |

* cited by examiner

*Primary Examiner* — Savitr Mulpuri
(74) *Attorney, Agent, or Firm* — Jacqueline J. Garner; Frank Cimino

(57) ABSTRACT

An integrated circuit containing core transistors and I/O transistors oriented perpendicular to the core transistors is formed by exposing a gate etch mask layer stack through a gate pattern photomask including core transistor gates and oversized I/O transistor gates. Core transistor gate lengths are defined by the gate pattern photomask. A first gate hardmask etch process removes the gate hardmask layer in exposed areas. The process continues with exposing a gate trim mask layer stack through a gate trim photomask. I/O gate lengths are defined by the gate trim photomask. A second gate hardmask etch process removes the gate hardmask layer in exposed areas. A gate etch operation removes polysilicon exposed by the gate hardmask layer to form gates for the core transistors and I/O transistors. The integrated circuit may also include I/O transistors oriented parallel to the core transistors, with gate lengths defined by the gate pattern photomask.

19 Claims, 28 Drawing Sheets

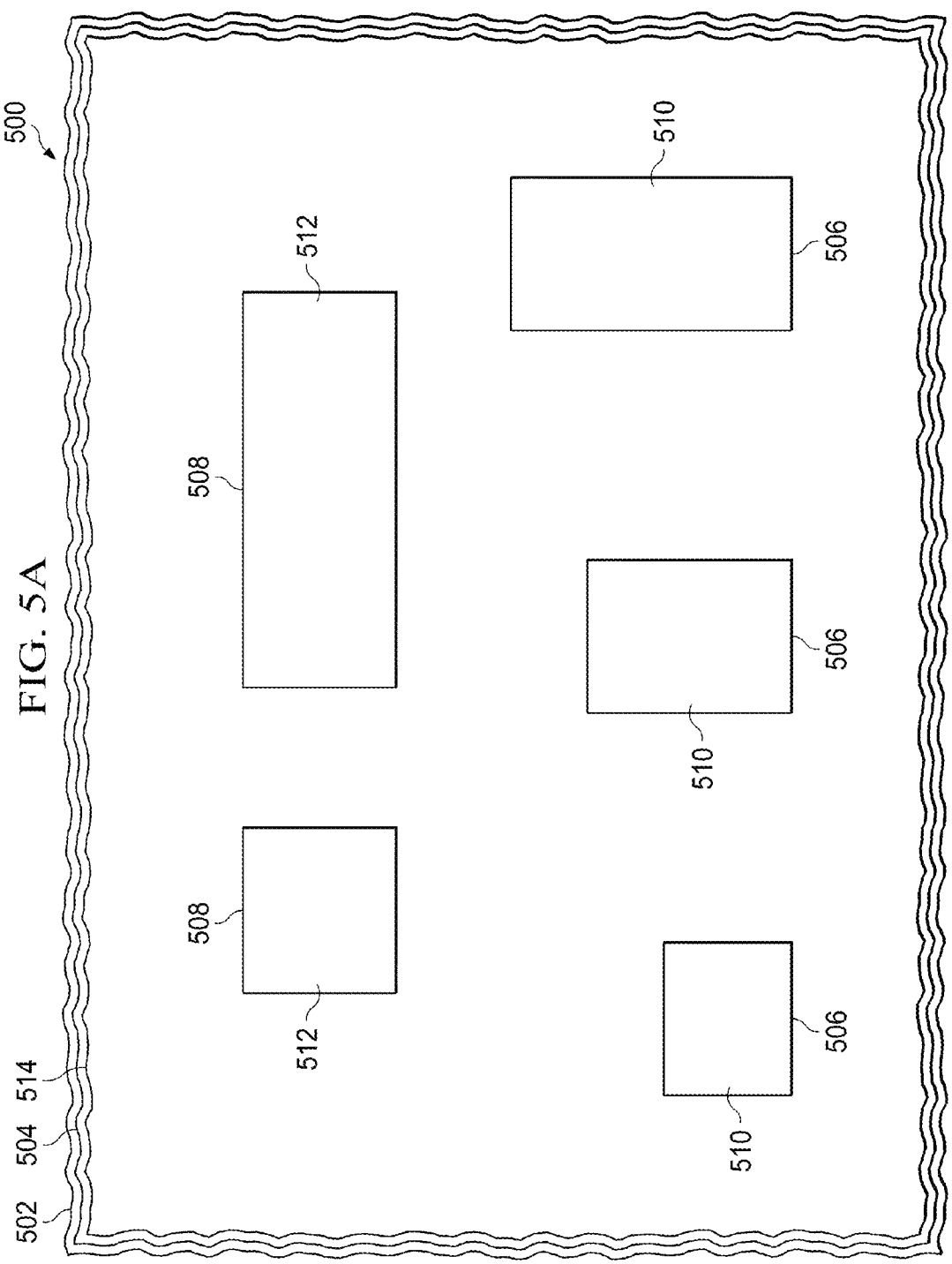

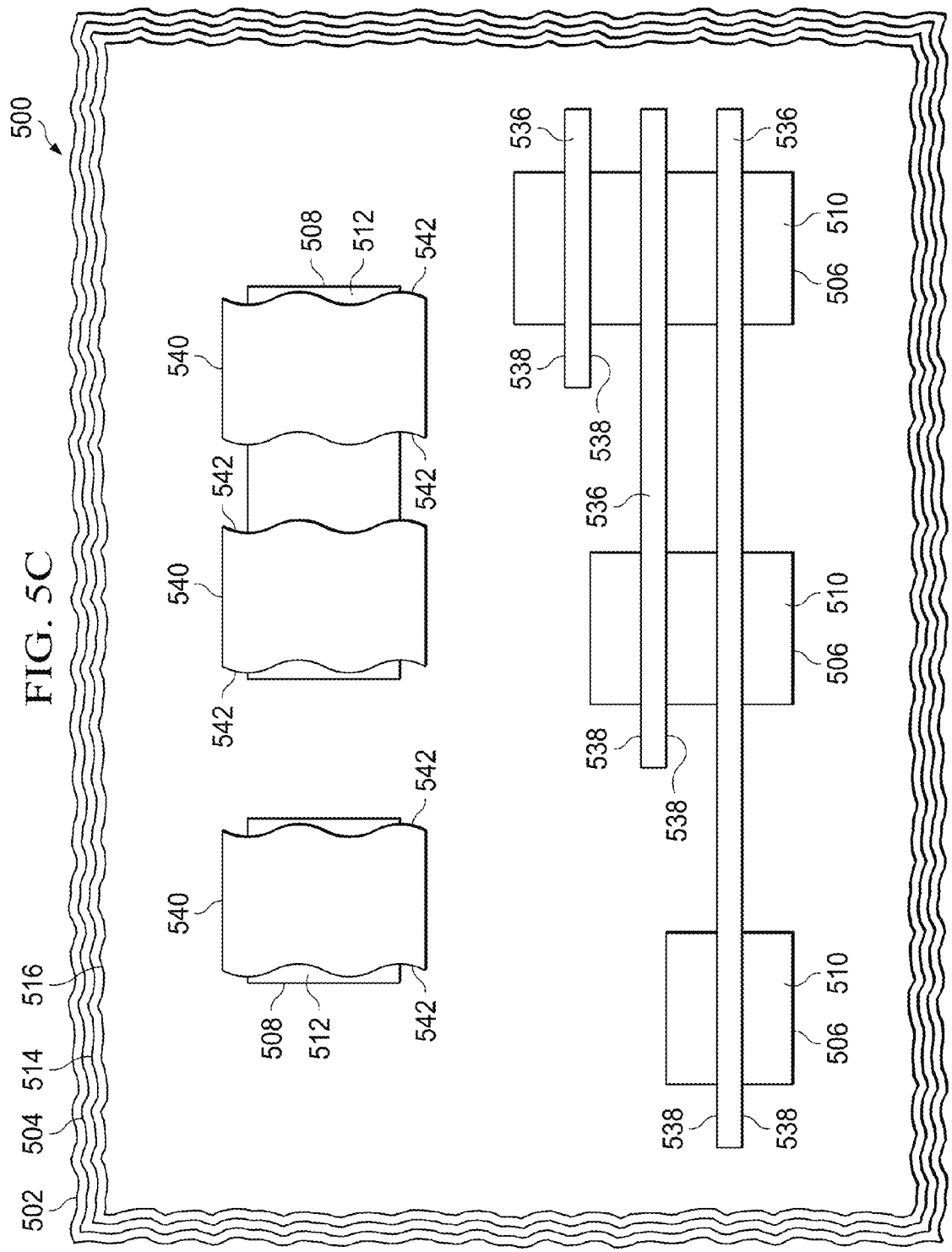

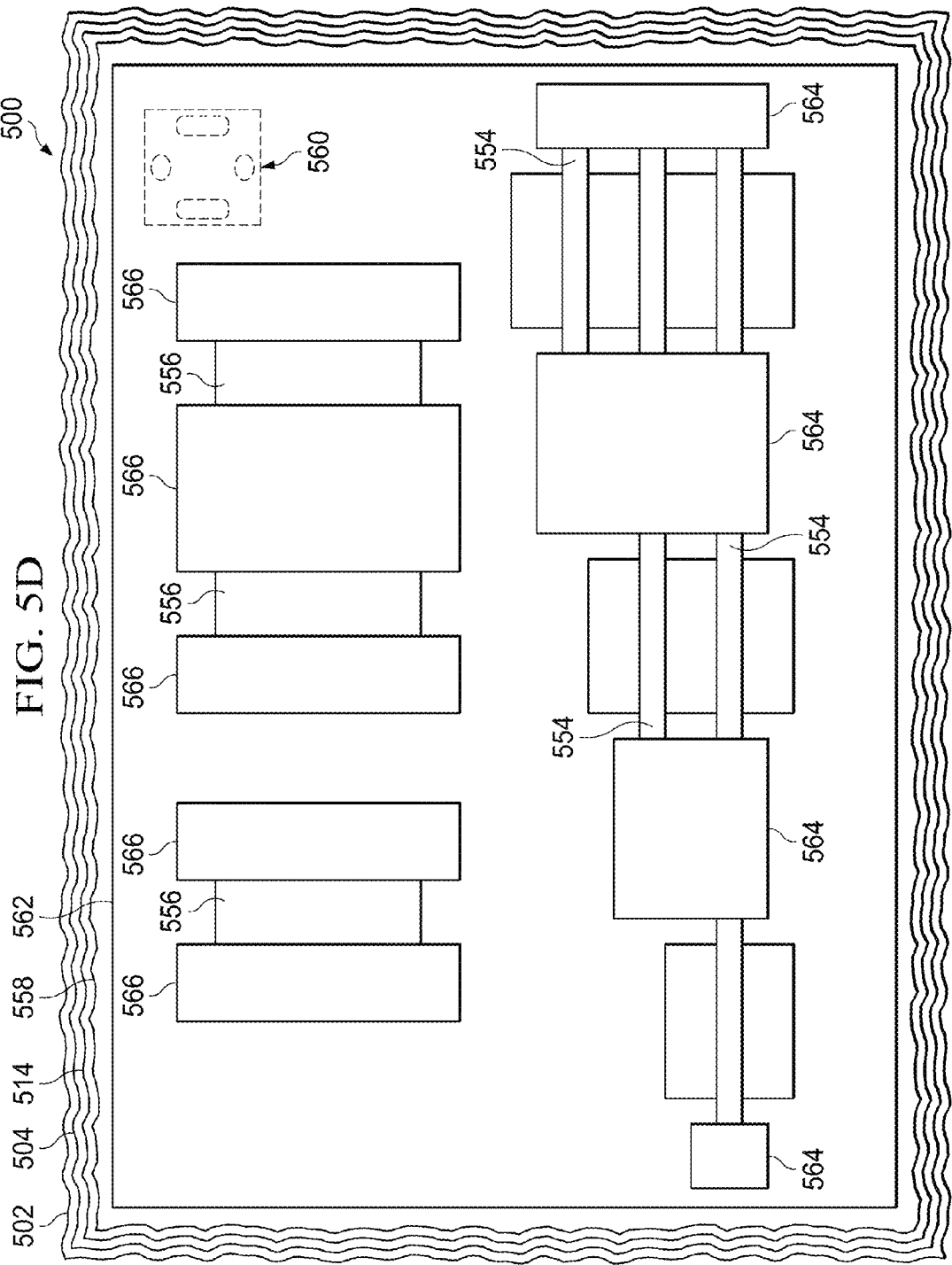

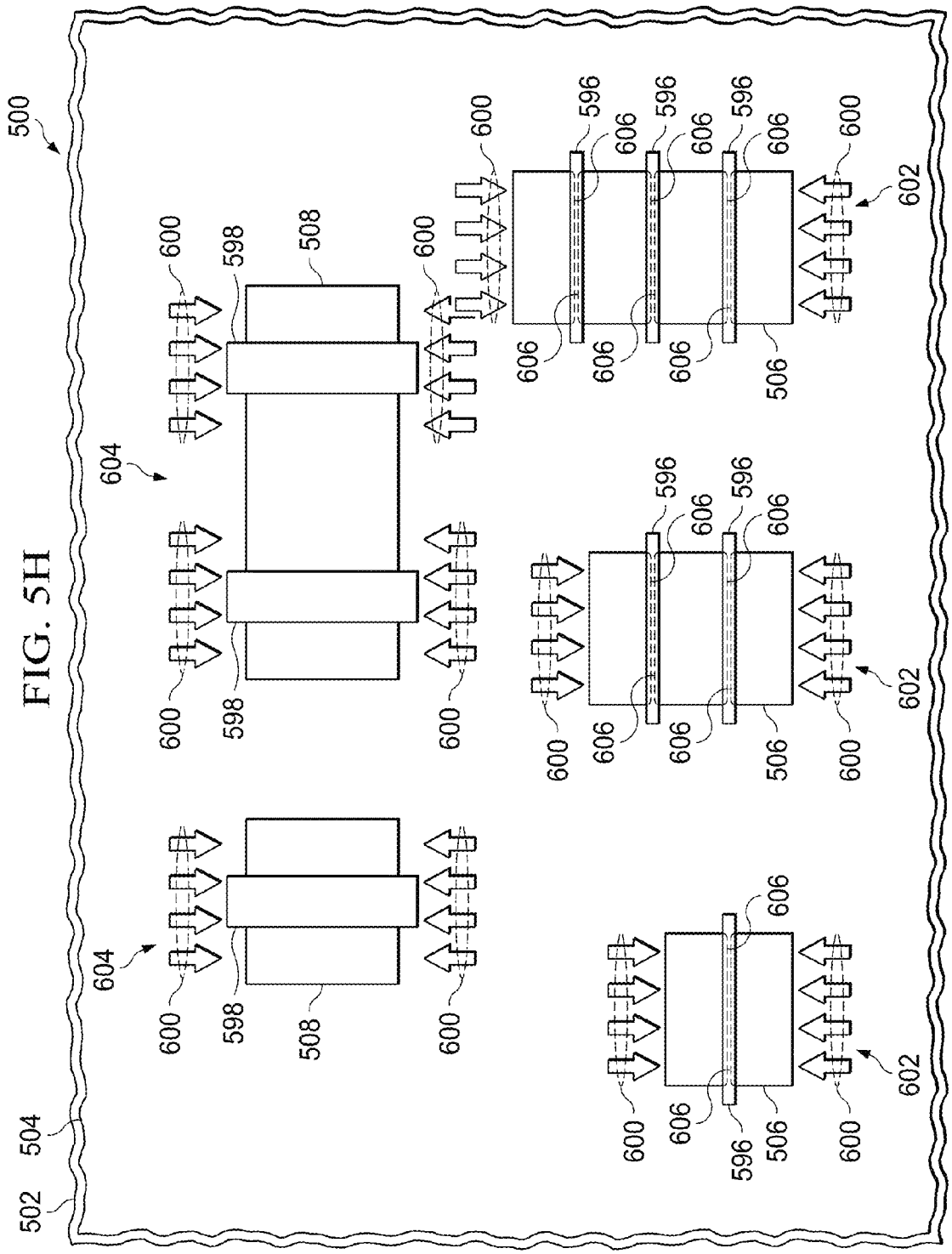

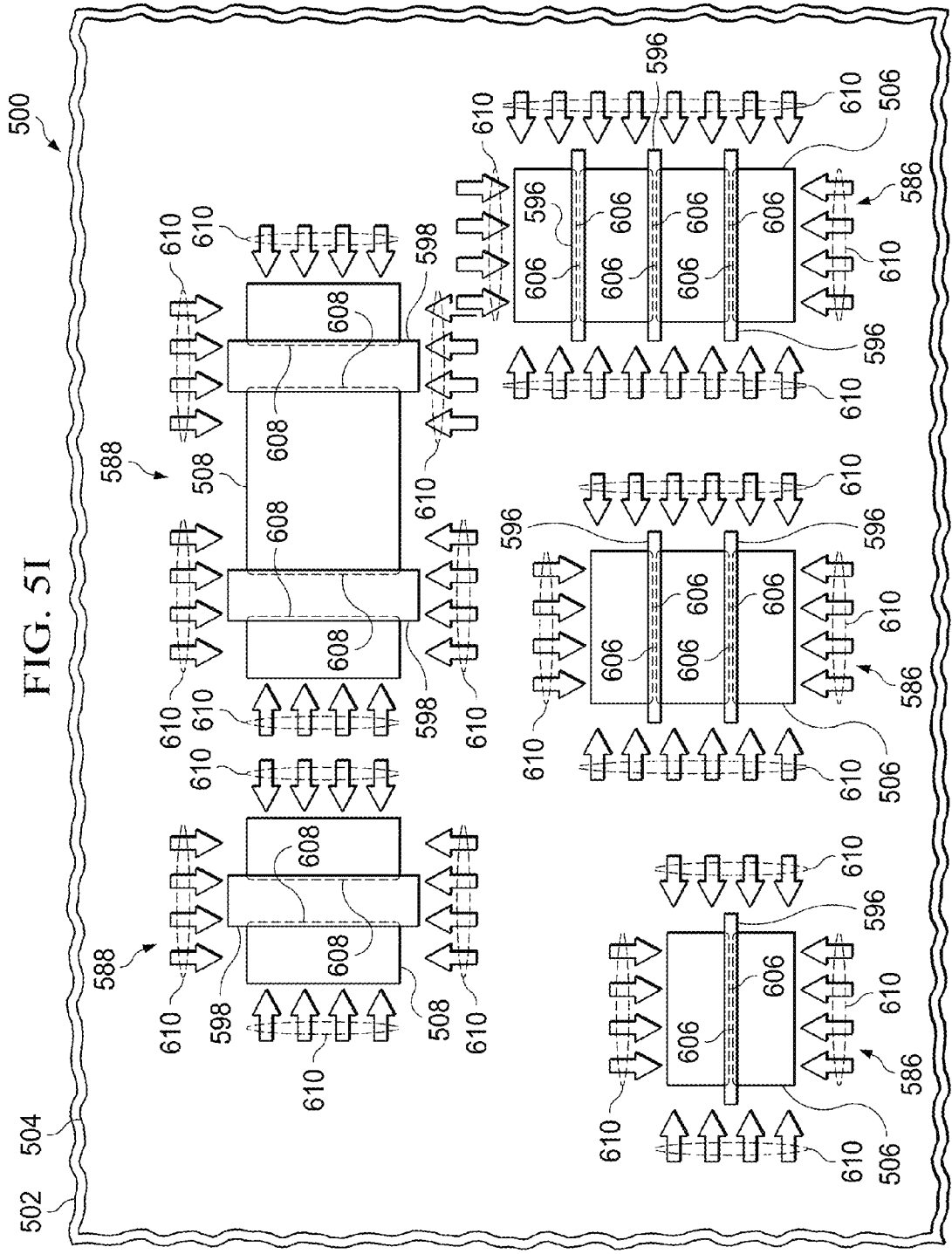

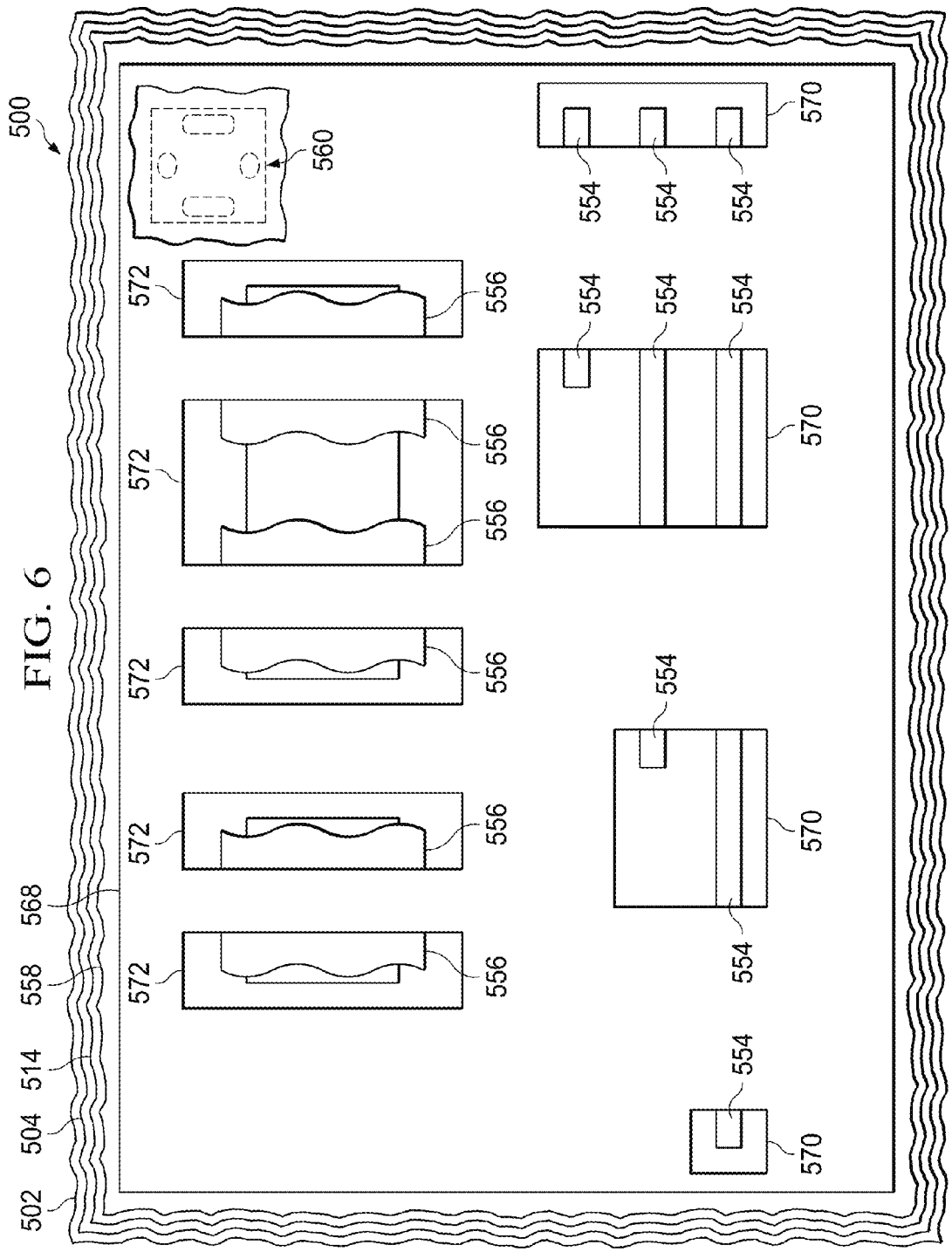

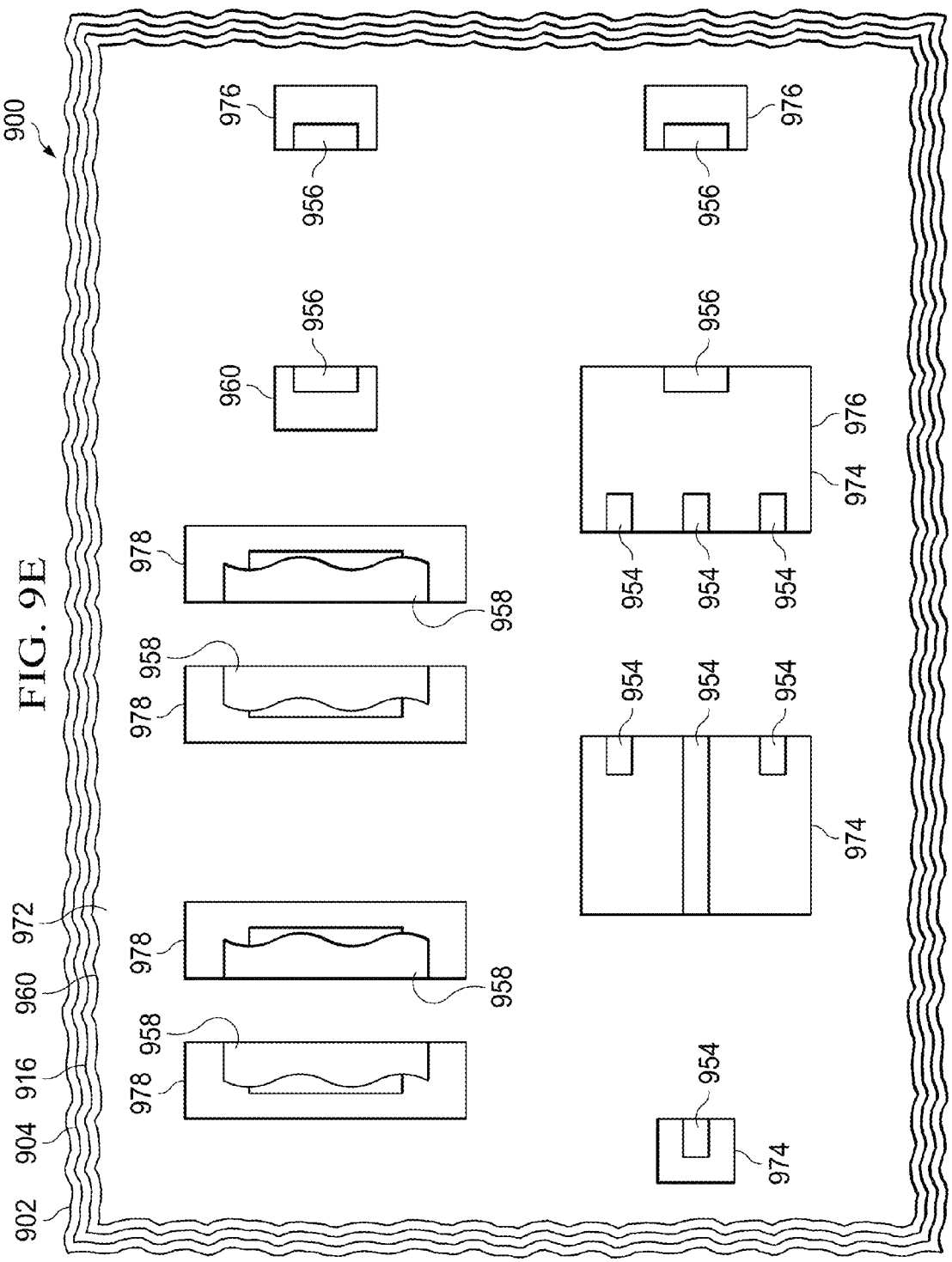

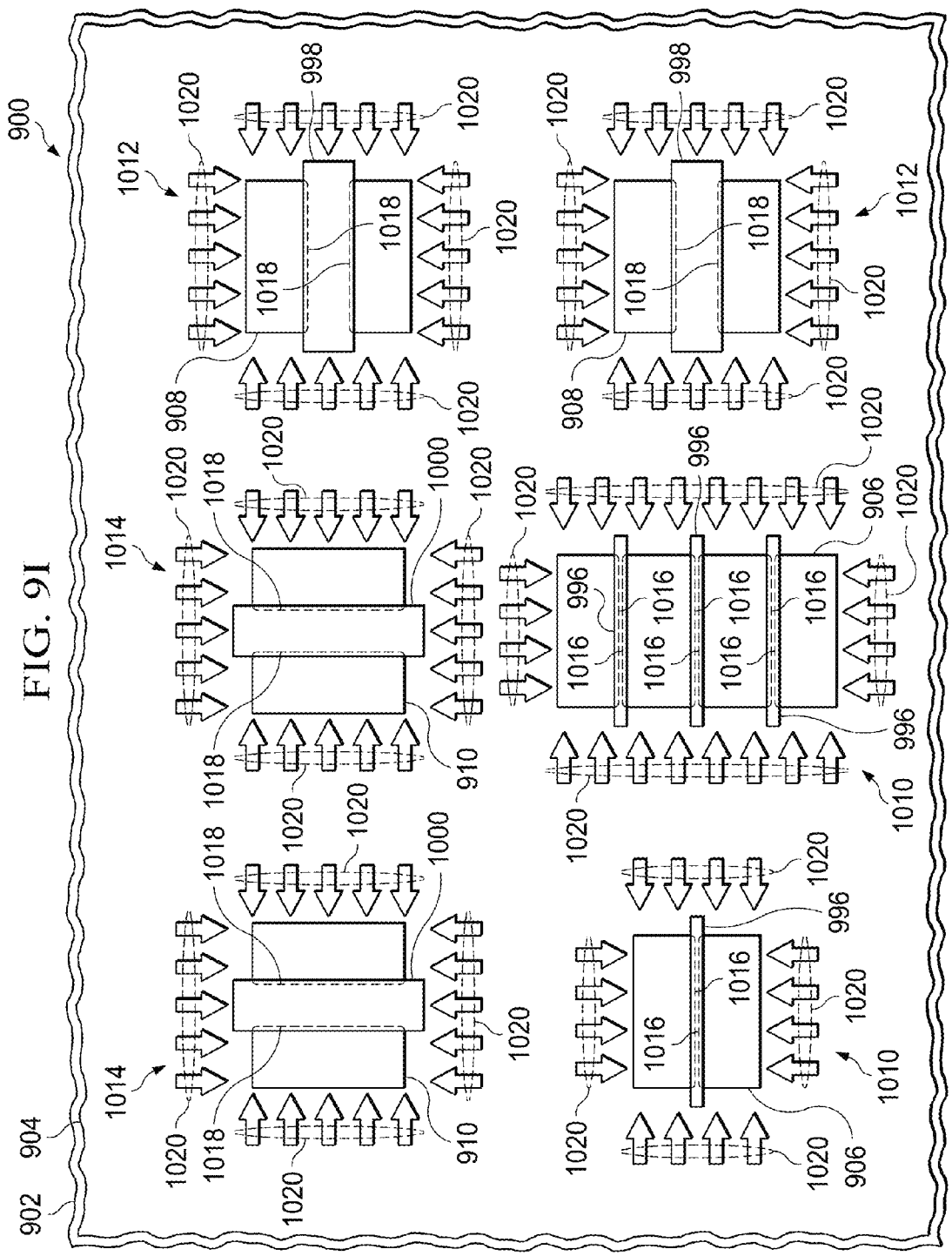

METHODOLOGY OF FORMING CMOS GATES ON THE SECONDARY AXIS USING DOUBLE-PATTERNING TECHNIQUE

CROSS-REFERENCE TO RELATED APPLICATIONS

This application claims the benefit of priority under U.S.C. §119(e) of U.S. Provisional Application 61/915,102, filed Dec. 12, 2013, which is hereby incorporated by reference in its entirety.

FIELD OF THE INVENTION

This invention relates to the field of integrated circuits. More particularly, this invention relates to photolithography processes used to form integrated circuits.

BACKGROUND OF THE INVENTION

An integrated circuit at the 28 nanometer node or beyond, containing core metal oxide semiconductor (MOS) transistors which operate at a core voltage, for example 1 to 1.5 volts, and input/output (I/O) MOS transistors which operate at a higher I/O voltage, for example, 1.8 to 2.5 volts, is fabricated using photolithography process with a 193 nanometer light source. Forming the core transistors and the I/O transistors while maintaining a fabrication cost and complexity of the integrated circuit at or below a desired level is problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing core transistors and I/O transistors oriented perpendicular to the core transistors is formed by exposing a gate etch mask layer stack through a gate pattern photomask including core transistor gates and oversized I/O transistor gates. Core transistor gate lengths are defined by the gate pattern photomask. A first gate hardmask etch process removes the gate hardmask layer in exposed areas. The process continues with exposing a gate trim mask layer stack through a gate trim photomask. I/O gate lengths are defined by the gate trim photomask. A second gate hardmask etch process removes the gate hardmask layer in exposed areas. A gate etch operation removes polysilicon exposed by the gate hardmask layer to form gates for the core transistors and I/O transistors. The integrated circuit may also include I/O transistors oriented parallel to the core transistors, with gate lengths defined by the gate pattern photomask.

DESCRIPTION OF THE VIEWS OF THE DRAWING

FIG. 5A through FIG. 5G are top views of an integrated circuit with core MOS transistors oriented in one direction and I/O MOS transistors oriented perpendicular to the core transistors, formed according to an example, depicted in successive stages of fabrication.

FIG. 5H through FIG. 5J depict alternative halo implant operations for the integrated circuit described in reference to FIG. 5A through FIG. 5E.

FIG. 6 depicts an alternate gate trim photolithography operation using a clear geometry gate trim photomask.

FIG. 9A through FIG. 9G are top views of an integrated circuit with core MOS transistors oriented in one direction, a first plurality of I/O MOS transistors oriented parallel to the core transistors and a second plurality of I/O MOS transistors oriented perpendicular to the core transistors, formed according to an example, depicted in successive stages of fabrication.

FIG. 9H through FIG. 9K depict alternative halo implant operations for the integrated circuit described in reference to FIG. 9A through FIG. 9F.

DETAILED DESCRIPTION OF EXAMPLE EMBODIMENTS

Figure 1:
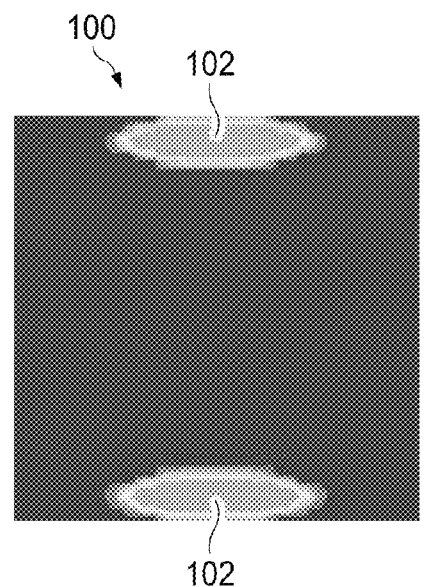
FIG. 1 depicts an example illumination source having a dipole component for photolithographic processes which may be used to form integrated circuits as described herein.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 depicts an example illumination source having a strong dipole component for photolithographic processes which may be used to form integrated circuits as described herein. The illumination source 100 is configured with two off axis dipole region emitting regions 102, so that the illumination source 100 has a strong dipole component. The illumination source 100 may provide, for example, 193 nanometer radiation, and may be used in an immersion photolithography tool which can resolve parallel equally spaced lines aligned with the dipole component of the illumination source 100 having a line/space pitch distance of 80 nanometers.

Figure 2:
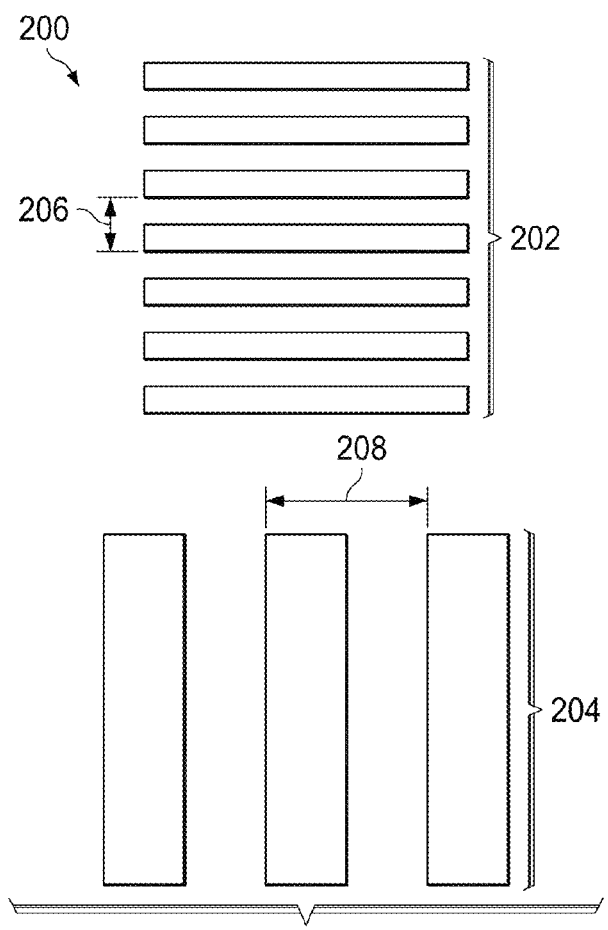
FIG. 2 depicts an example pattern formed by an illumination source with a strong dipole component, such as illumination source, oriented as depicted in FIG. 1.

FIG. 2 depicts an example pattern formed by an illumination source with a strong dipole component, such as illumination source 100, oriented as depicted in FIG. 1. The pattern 200 includes a first plurality of minimum pitch equally spaced parallel lines 202 oriented with the strong dipole component of the illumination source 100, and a second plurality of minimum pitch equally spaced lines 204 aligned perpendicular to the dipole component. A first minimum line/space pitch distance 206 of the first plurality of equally spaced parallel lines 202 is significantly smaller, for example by a factor of three, than a second minimum line/space pitch distance 208 of the second plurality of equally spaced parallel lines 204, due to the strong dipole component. For example, the illumination source may provide 193 nanometer radiation, and the illumination source dipole component may be configured so that the first minimum line/space pitch distance 206 is 80 nanometers and the second minimum line/space pitch distance 208 is 240 nanometers.

Figure 3:
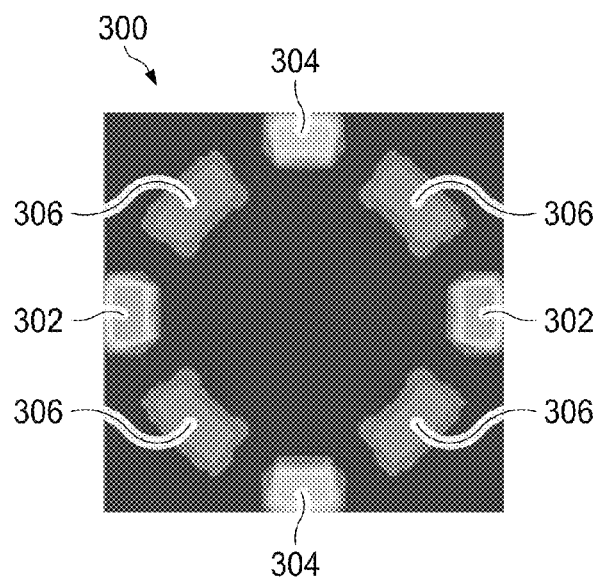
FIG. 3 depicts an example composite dipole-quadrupole-octopole off-axis illumination source having a moderate dipole component for photolithographic processes which may be used to form integrated circuits as described herein.

FIG. 3 depicts an example composite dipole-quadrupole-octopole off-axis illumination source 300 having a moderate dipole component for photolithographic processes which may be used to form integrated circuits as described herein. The moderate dipole illumination source 300 is configured with two strong emitting regions 302 along the vertical direction, two moderate emitting regions 304 along the horizontal direction, and four weak emitting regions 306 along diagonal directions.

Figure 4:
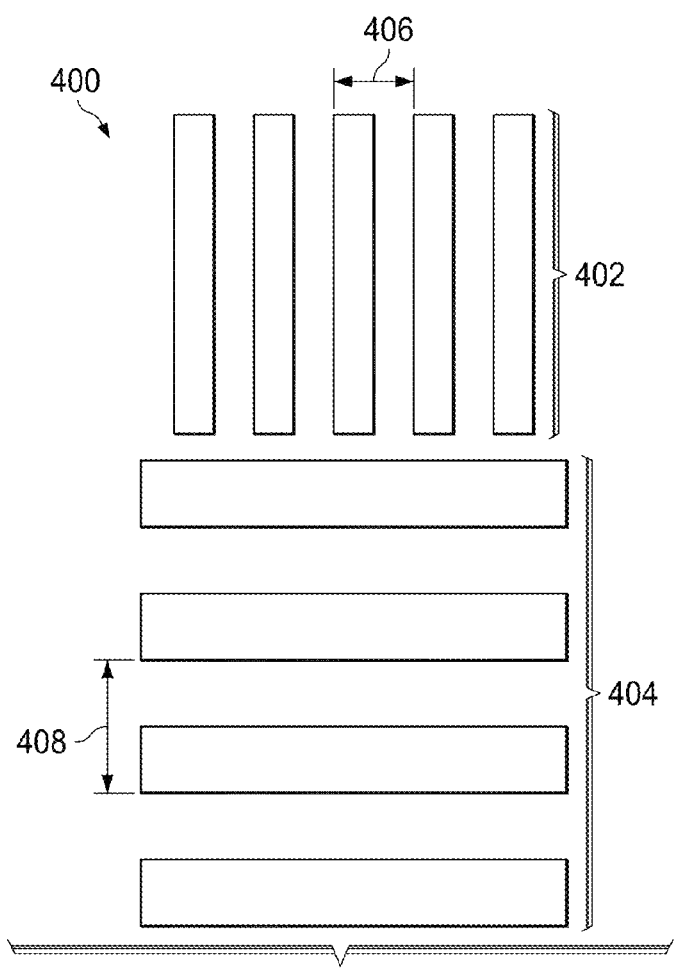
FIG. 4 depicts an example pattern formed by an illumination source with a moderate dipole component, such as illumination source, oriented as depicted in FIG. 3.

FIG. 4 depicts an example pattern formed by an illumination source with a moderate dipole component, such as illumination source 300, oriented as depicted in FIG. 3. The pattern 400 includes a first plurality of minimum pitch distance equally spaced parallel lines 402 oriented with the moderate dipole component of the illumination source 300, and a second plurality of minimum pitch distance equally spaced lines 404 aligned perpendicular to the dipole component. A first minimum line/space pitch distance 406 of the first plurality of equally spaced parallel lines 402 is smaller, for example by a factor of one and one-half, than a second minimum line/space pitch distance 408 of the second plurality of equally spaced parallel lines 404, due to the moderate dipole component. For example, the illumination source may provide 193 nanometer radiation, and the illumination source dipole component may be configured so that the first minimum line/space pitch distance 406 is 115 nanometers and the second minimum line/space pitch distance 408 is 170 nanometers.

Figure 5B:
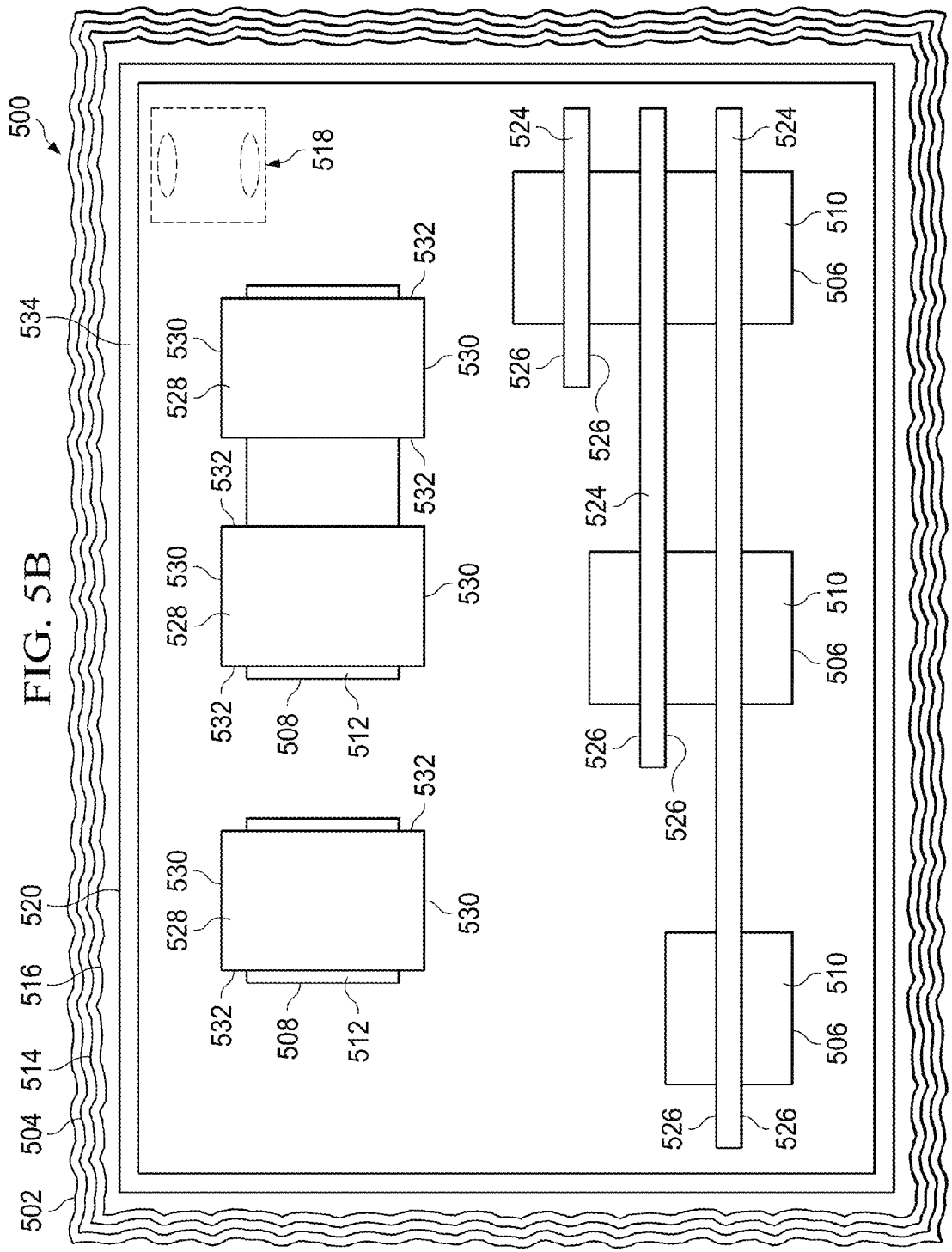

FIG. 5A through FIG. 5G are top views of an integrated circuit with core MOS transistors oriented in one direction and I/O MOS transistors oriented perpendicular to the core transistors, formed according to an example, depicted in successive stages of fabrication. Referring to FIG. 5A, the integrated circuit 500 is formed in and on a semiconductor substrate 502, for example, a single crystal silicon wafer, a silicon-on-insulator (SOI) wafer, a hybrid orientation technology (HOT) wafer with regions of different crystal orientations, a silicon wafer with an epitaxial layer, or other material appropriate for fabrication of the integrated circuit 500. A layer of field oxide 504 is formed at a top surface of the substrate 502. The field oxide 504 may be, for example, silicon dioxide between 250 and 400 nanometers thick, formed by a shallow trench isolation (STI) process. An STI process may include the steps of: forming an oxide layer on the substrate 502, forming a silicon nitride layer on the oxide layer, patterning the silicon nitride layer so as to expose an area for the field oxide 504, etching a trench in the substrate 502 in the exposed area to an appropriate depth for a desired thickness of the field oxide 504, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer.

A first plurality of openings 506 in the field oxide 504 provide core active areas 506 for the core transistors, and a second plurality of openings 508 provide I/O active areas 508 for the I/O transistors. A core gate dielectric layer 510 is formed at the top surface of the substrate 502 in the core active areas 506, and an I/O gate dielectric layer 512 is formed at the top surface of the substrate 502 in the I/O active areas 508.

In one version of the instant example, the I/O gate dielectric layer 512 may be formed concurrently with, and be a same thickness as, the core gate dielectric layer 510. For example, the core gate dielectric layer 510 and the I/O gate dielectric layer 512 may be formed concurrently to be one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The core gate dielectric layer 510 and the I/O gate dielectric layer 512 may include nitrogen as a result of exposure to a nitrogen containing plasma or a nitrogen containing ambient gas at temperatures between 50 C. and 800 C. The core gate dielectric layer 510 and the I/O gate dielectric layer 512 may be 1 to 4 nanometers thick. The core gate dielectric layer 510 and the I/O gate dielectric layer 512 may be formed by any of a variety of gate dielectric formation processes, for example thermal oxidation, plasma nitridation of an oxide layer, and/or dielectric material deposition by atomic layer deposition (ALD).

In another version of the instant example, at least a portion of the I/O gate dielectric layer 512 may be formed separately from the core gate dielectric layer 510 so that the I/O gate dielectric layer 512 is thicker than the core gate dielectric layer 510. For example, I/O gate dielectric layer 512 may be at least 1½ times thicker than the core gate dielectric layer 510. The I/O gate dielectric layer 512 may be formed in two stages, so that a second of the two stages is formed concurrently with the core gate dielectric layer 510.

A gate layer stack 514 is formed over the field oxide 504, the core gate dielectric layer 510 and the I/O gate dielectric layer 512. The gate layer stack 514 includes a bottom layer of polysilicon 30 to 60 nanometers thick, and a gate hardmask layer, for example silicon nitride 60 to 80 nanometers thick, over the polysilicon layer. The bottom layer of polysilicon may be formed, for example, by thermally decomposing silane gas inside a low-pressure reactor at a temperature between 580° C. to 650° C. The gate hardmask layer may be formed, for example, using a plasma enhanced chemical vapor deposition (PECVD) process. Features such as the core active areas 506 and the I/O active areas 508 under the gate layer stack 514 are depicted with solid lines to improve clarity of the Figures.

Referring to FIG. 5B, a gate etch pattern stack 516 is formed over the gate layer stack 514. The gate etch pattern stack 516 may include, for example, a layer of amorphous carbon hardmask 60 to 120 nanometers thick over the gate layer stack 514. The amorphous carbon hardmask may be, for example, a layer of Advanced Patterning Film (APF) from Applied Materials, Inc., Or a layer of Ashable Hardmask (AHM) from Novellus Systems, Inc. The gate etch pattern stack 516 may further include a layer of dielectric hardmask such as 20 to 40 nanometers of silicon oxynitride formed by PECVD. The gate etch pattern stack 516 may further include a layer of organic bottom anti-reflection coat (BARC) such as 20 to 40 nanometers of a spin-on BARC. The gate etch pattern stack 516 has a top layer of photoresist, such as an amplified positive tone resist sensitive to 193 nanometer illumination. Features such as the core active areas 506 and the I/O active areas 508 under the gate etch pattern stack 516 are depicted with solid lines to improve clarity of the Figures. A gate pattern photolithography operation is performed which uses an illumination source with a strong dipole component, for example as described in reference to FIG. 1 and oriented as depicted by example illumination source 518, and a first gate photomask 520, referred to as gate pattern photomask 520, with dark geometries, to expose the gate etch pattern stack 516 outside of areas for gates of the core transistors and I/O transistors. The dark geometries of the gate pattern photomask 520 include core gate geometries 524 in areas defined for gates of the core transistors. The core gate geometries 524 are oriented with the strong dipole component of the illumination source 518 as described in reference to FIG. 2, so that edges 526 of the core gate geometries 524 define gate lengths of the core transistors. The gate pattern photomask 520 also includes I/O gate geometries 528 in areas defined for gates of the I/O transistors. The I/O gate geometries 528 are oriented perpendicular to the core gate geometries 524. Ends 530 of the I/O gate geometries 528 define ends for the I/O transistors. Edges 532 of the I/O gate geometries 528 oriented perpendicular to the strong dipole component of the illumination source 518 are oversized for the I/O transistors, for example by 20 nanometers. The gate pattern photomask 520 may further include an optional border 534.

Referring to FIG. 5C, a positive tone develop operation is performed which leaves photoresist of the gate etch pattern stack 516 in areas defined by the dark geometries of the gate pattern photomask 520. The developed photoresist areas of the gate etch pattern stack 516 include core pattern portions 536 over the core active areas 506. The core pattern portions 536 have edges 538 which define gate lengths of the core transistors. The developed photoresist areas of the gate etch pattern stack 516 also include I/O pattern portions 540 over the I/O active areas 508. The I/O pattern portions 540 have edges 542 which may exhibit undesired wavy contours as depicted in FIG. 5C as a result of "ringing" during exposure with the gate pattern strong dipole illumination source.

Figure 7A:
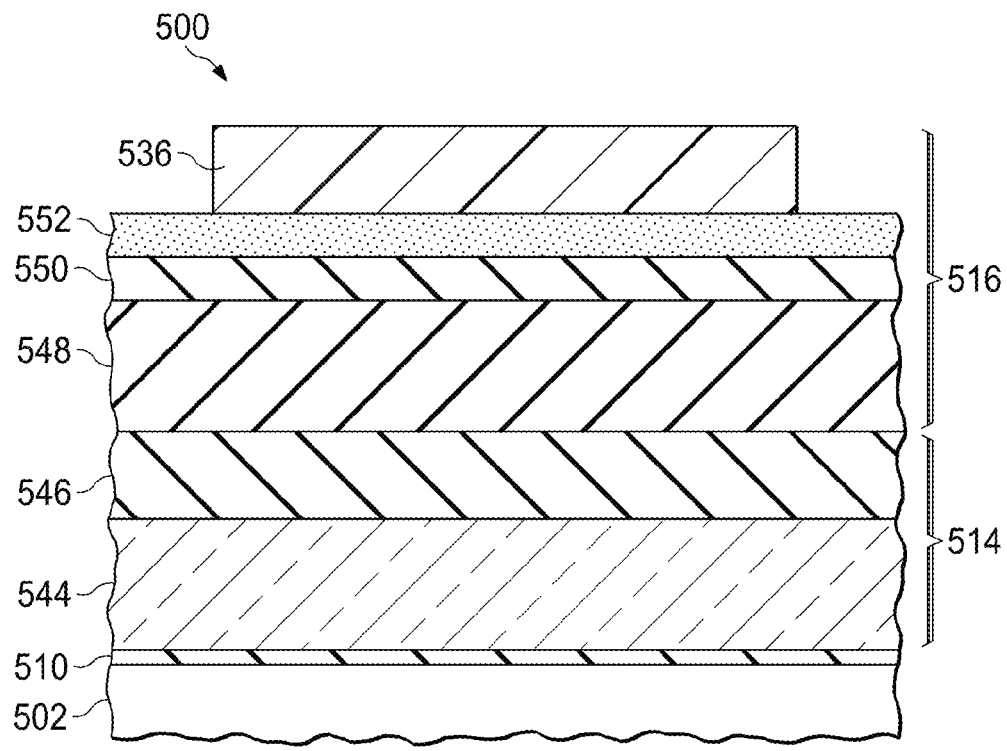
FIG. 7A through FIG. 7D are cross sections depicting the first gate hardmask etch process.

A first gate hardmask etch process is performed which transfers the pattern of the developed photoresist of the gate etch pattern stack 516 to the gate hardmask layer of the gate layer stack 514 by removing the gate hardmask layer under areas exposed by the developed photoresist. The first gate hardmask etch process is depicted in cross section for an instance of the core transistors in FIG. 7A through FIG. 7D. Steps of the first gate hardmask etch process for the I/O transistors and elsewhere on the integrated circuit 500 follow a similar recital. Referring to FIG. 7A, the integrated circuit 500 has the core gate dielectric layer 510 over the substrate 502. The gate layer stack 514 includes the bottom layer of polysilicon 544 over the core gate dielectric layer 510 and the gate hardmask layer 546 over the polysilicon 544. The gate etch pattern stack 516 includes the layer of amorphous carbon hardmask 548 over the gate hardmask layer 546, the layer of dielectric hardmask 550 over the layer of amorphous carbon hardmask 548, the layer of BARC 552 over the layer of dielectric hardmask 550, and the core pattern portions 536 of the developed photoresist areas.

Figure 7B:
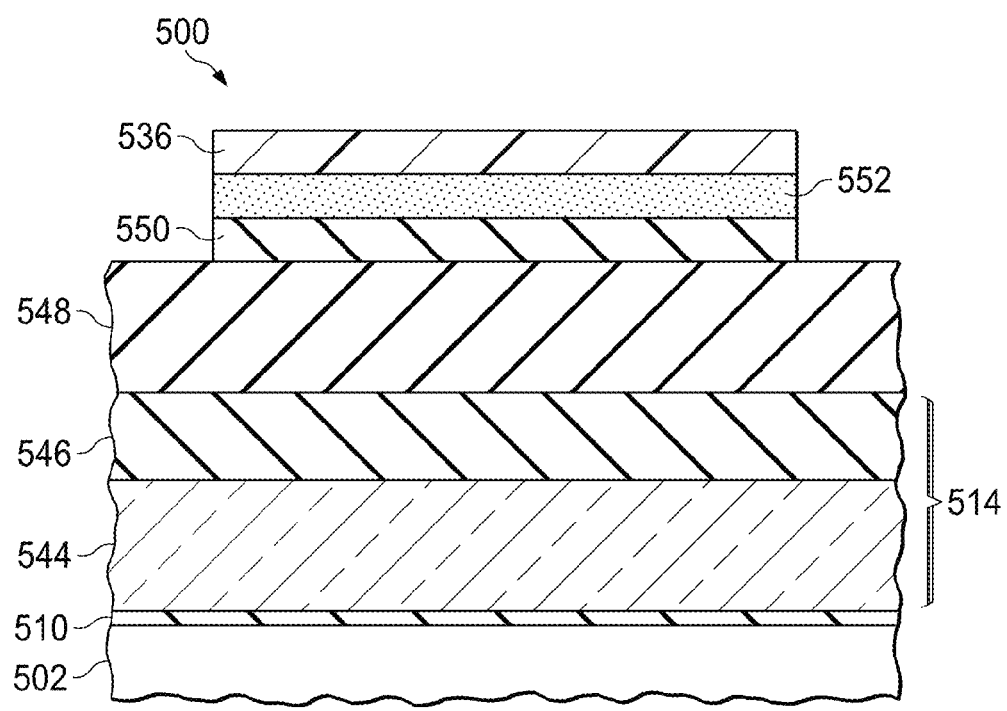

Referring to FIG. 7B, a first etch step of the first gate hardmask etch process is performed which removes the layer of BARC 552 and the layer of dielectric hardmask 550 in areas exposed by the core pattern portions 536 of the developed photoresist areas. At least a portion of the core pattern portions 536 of the developed photoresist is removed by the first etch step.

Figure 7C:
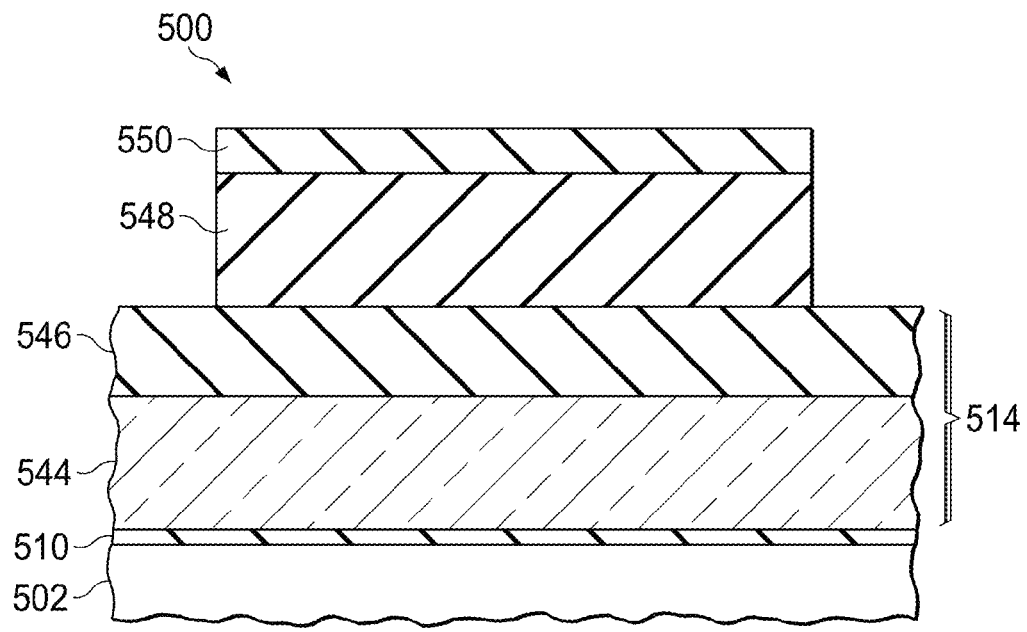

Referring to FIG. 7C, a second etch step of the first gate hardmask etch process is performed which removes the layer of amorphous carbon hardmask 548 in areas exposed by the dielectric hardmask 550. Remaining portions of the core pattern portions 536 of the developed photoresist and the layer of BARC 552 may be removed by the second etch step.

Figure 7D:
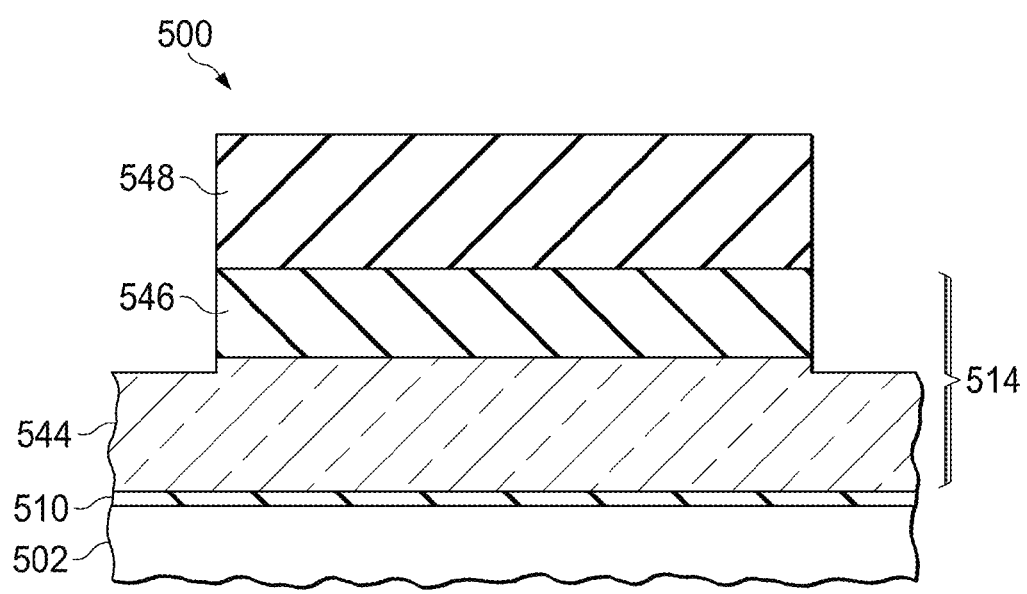

Referring to FIG. 7D, a third etch step of the first gate hardmask etch process is performed which removes the gate hardmask layer 546 in areas exposed by the amorphous carbon hardmask 548. Remaining portions of the dielectric hardmask 550 may be removed by the third etch step. After the third etch step is completed, remaining amorphous carbon hardmask 548 is removed, for example by ashing.

Fabrication of the integrated circuit 500 continues with reference to FIG. 5D. Core transistor portions 554 and I/O transistor portions 556 of the gate hardmask layer 546 are depicted with a coarse stipple pattern. A tri-layer gate trim pattern stack 558 is formed over the gate layer stack 514. The gate trim pattern stack 558 includes a spin-on layer of organic polymer such as novolak resin 80 to 180 nanometers thick over the gate layer stack 514. The gate trim pattern stack 558 further includes a layer of 20 to 40 nanometers of spin-on silicon-containing hardmask available from Brewer Science, Inc., Dow corning Corporation, JSR Corporation, AZ Electronic Materials, and other suppliers of lithographic materials. The gate trim pattern stack 558 has a top layer of amplified positive tone 193 nanometer sensitive photoresist.

A gate trim photolithography operation is performed which uses an illumination source with a moderate dipole component, for example as described in reference to FIG. 3 and oriented as depicted by example illumination source 560, or possibly an isotropic illumination source. The gate trim photolithography operation uses a dark geometry second gate photomask 562, referred to as a dark geometry gate trim photomask 562, which has dark geometries, to expose the gate trim pattern stack 558 so as to define edges of the I/O transistor gates which were oversized by the gate pattern photolithography operation. The dark geometries of the gate trim photomask 562 include dark core end trim areas 564 and dark I/O gate edge trim areas 566. The gate trim photolithography operation exposes the gate trim pattern stack 558 outside the core end trim areas 564 to define ends of core gate areas, and exposes the gate trim pattern stack 558 outside the I/O gate edge trim areas 566 to define edges for gate lengths of the I/O transistors. A negative tone develop operation is performed which removes the top layer of photoresist in the gate trim pattern stack 558 from the areas exposed by the gate trim photolithography operation, that is areas outside the dark geometries of the dark geometry gate trim photomask 562.

Alternatively, an alternate gate trim photolithography operation may use a clear geometry gate trim photomask 568 as depicted in FIG. 6. The clear geometry gate trim photomask 568 has clear geometries including clear core end trim areas 570 and clear I/O gate edge trim areas 572. The gate trim photolithography operation exposes the gate trim pattern stack 558 in the clear core end trim areas 570 to define ends of core gate areas, and exposes the gate trim pattern stack 558 in the clear I/O gate edge trim areas 572 to define edges for gate lengths of the I/O transistors. A negative tone develop operation is performed which removes the top layer of photoresist in the gate trim pattern stack 558 from the areas exposed by the alternate gate trim photolithography operation, that is areas in the dark geometries of the clear geometry gate trim photomask 568.

Figure 5E:
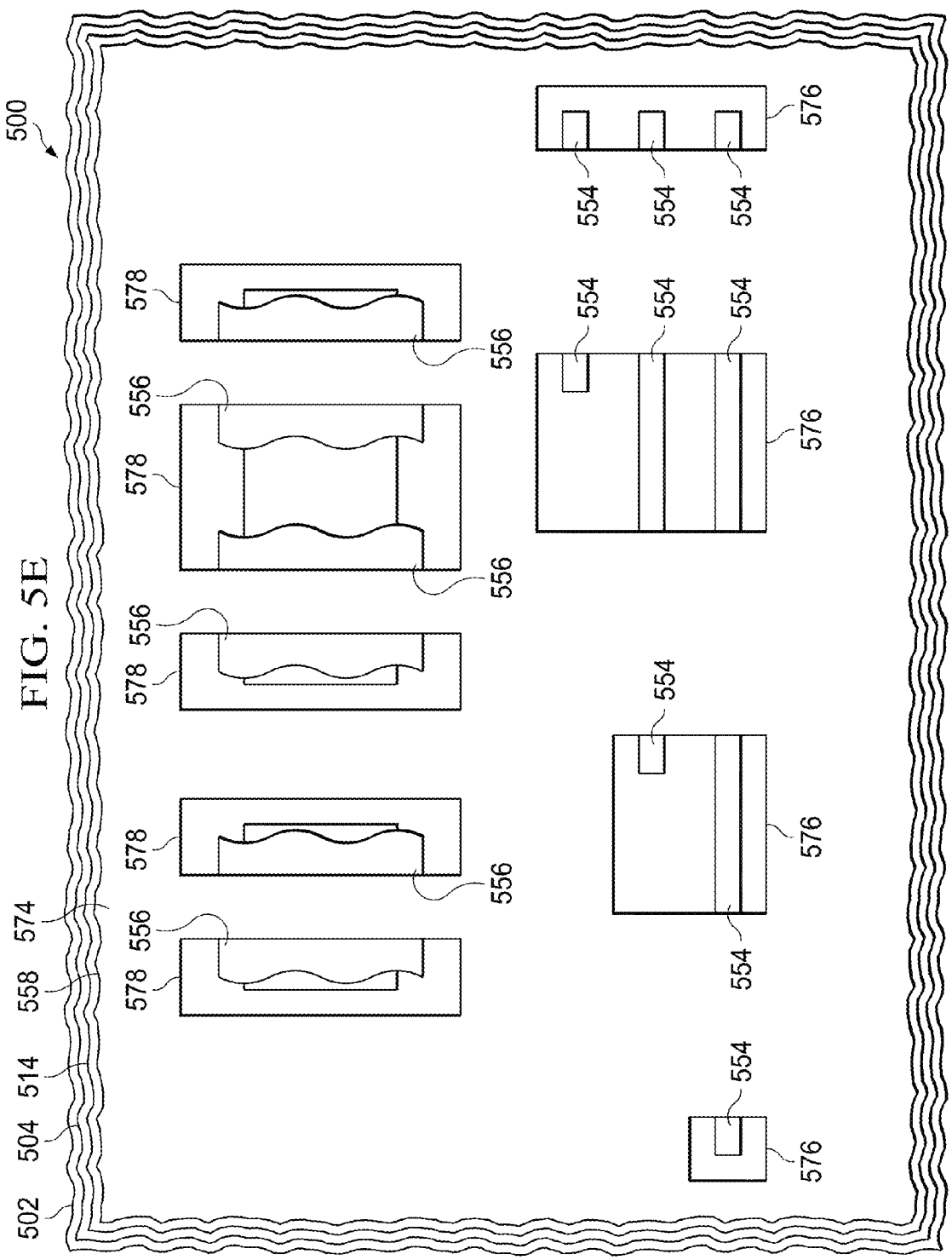

Developed photoresist 574 from the gate trim photolithography operation discussed in reference to FIG. 5D, or the alternate gate trim photolithography operation discussed in reference to FIG. 6, is depicted in FIG. 5E with a light stipple pattern. Open areas in the developed photoresist 574 include core end trim areas 576 exposing the core transistor portions 554 of the gate hardmask layer 546 and I/O gate edge trim areas 578 exposing the I/O transistor portions 556 of the gate hardmask layer 546.

Figure 8A:
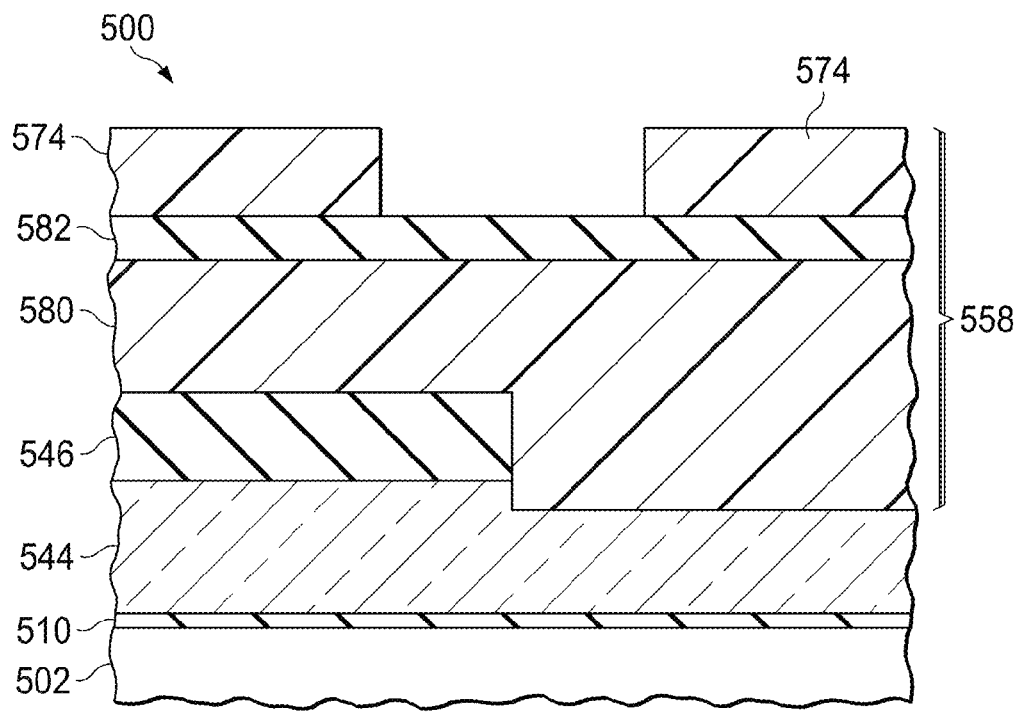
FIG. 8A through FIG. 8D are cross sections depicting the second gate hardmask etch process.

A second gate hardmask etch process is performed which transfers the pattern of the developed photoresist 574 of the gate trim pattern stack 558 to the gate hardmask layer 546 of the gate layer stack 514 by removing the gate hardmask layer 546 under areas exposed by the developed photoresist 574. The second gate hardmask etch process is depicted in cross section for an instance of the core transistors in FIG. 8A through FIG. 8D. Steps of the second gate hardmask etch process for the I/O transistors and elsewhere on the integrated circuit 500 follow a similar recital. Referring to FIG. 8A, the integrated circuit 500 has the core gate dielectric layer 510 over the substrate 502. The gate layer stack 514 includes the bottom layer of polysilicon 544 over the core gate dielectric layer 510 and the gate hardmask layer 546 over the polysilicon 544. The gate trim pattern stack 558 includes the layer of spin-on organic polymer 580 over the gate hardmask layer 546, the layer of spin-on silicon-containing hardmask 582 over the layer of spin-on organic polymer 580, and the developed photoresist 574.

Figure 8B:
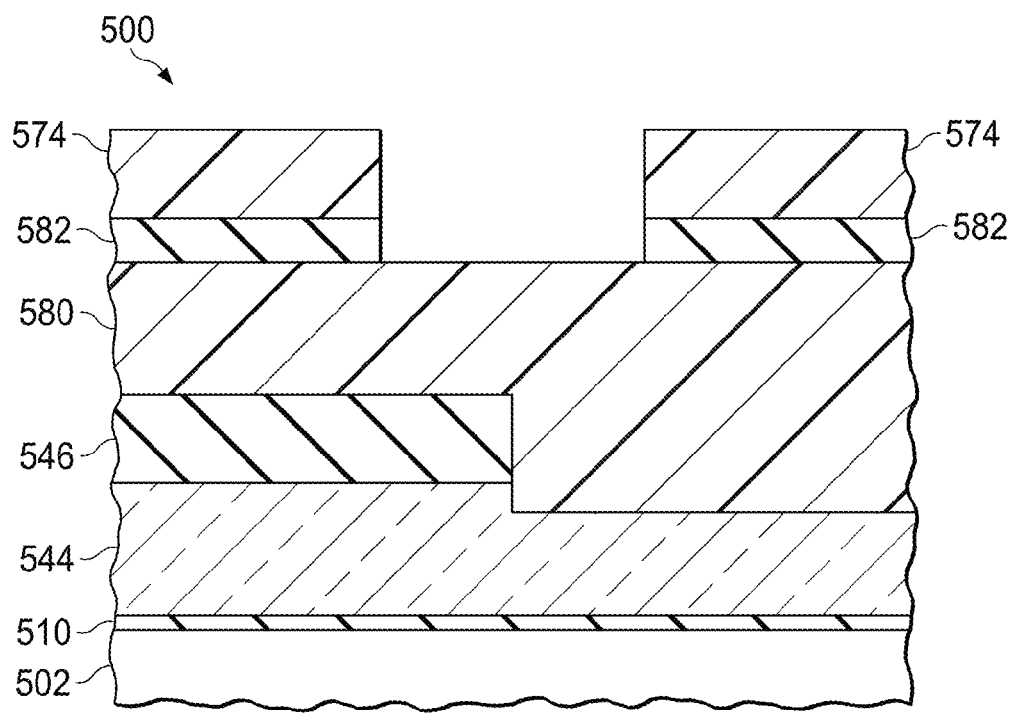

Referring to FIG. 8B, a first etch step of the second gate hardmask etch process is performed which removes the layer of spin-on silicon-containing hardmask 582 in the core end trim areas 576 of the developed photoresist 574. At least a portion of the developed photoresist 574 is removed by the first etch step.

Figure 8C:
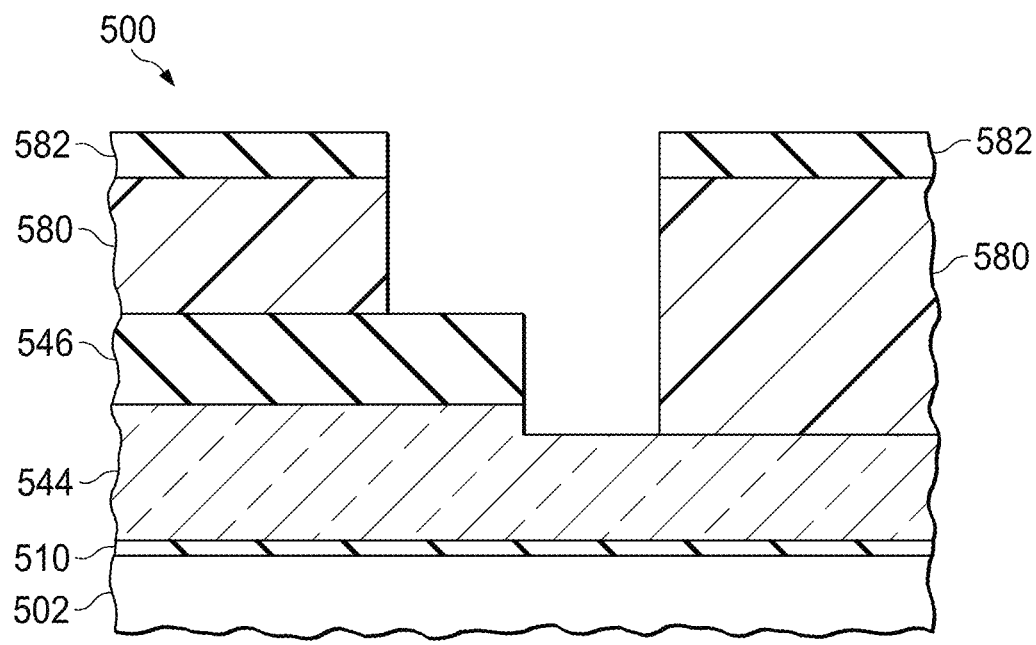

Referring to FIG. 8C, a second etch step of the second gate hardmask etch process is performed which removes the layer of spin-on organic polymer 580 in the core end trim areas 576. The developed photoresist 574 may be removed by the second etch step.

Figure 8D:
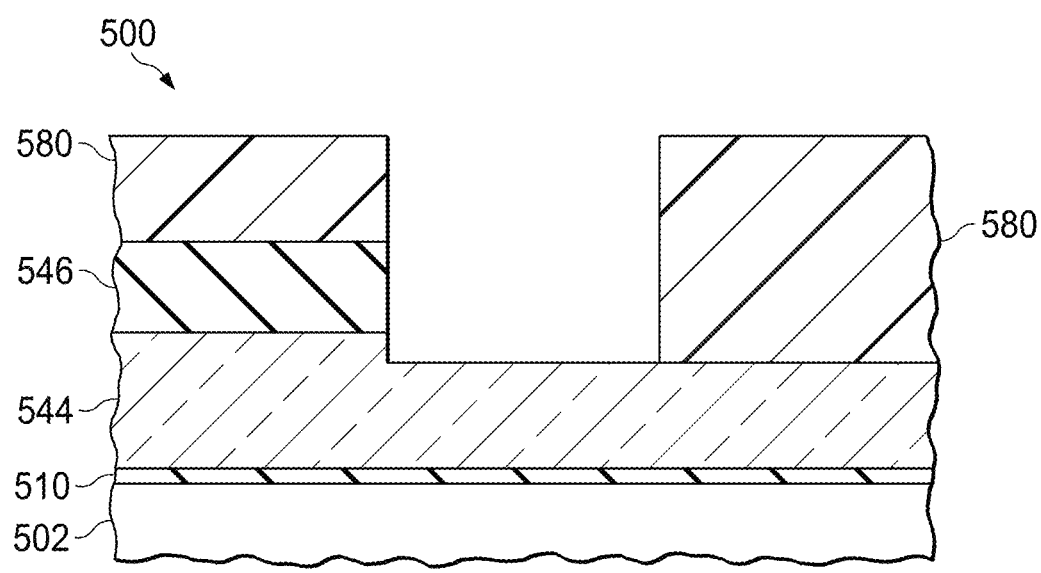

Referring to FIG. 8D, a third etch step of the second gate hardmask etch process is performed which removes the gate hardmask layer 546 in the core end trim areas 576. The layer of spin-on silicon-containing hardmask 582 is removed by the third etch step. After the third etch step is completed, remaining spin-on organic polymer 580 is removed, for example by ashing.

Figure 5F:
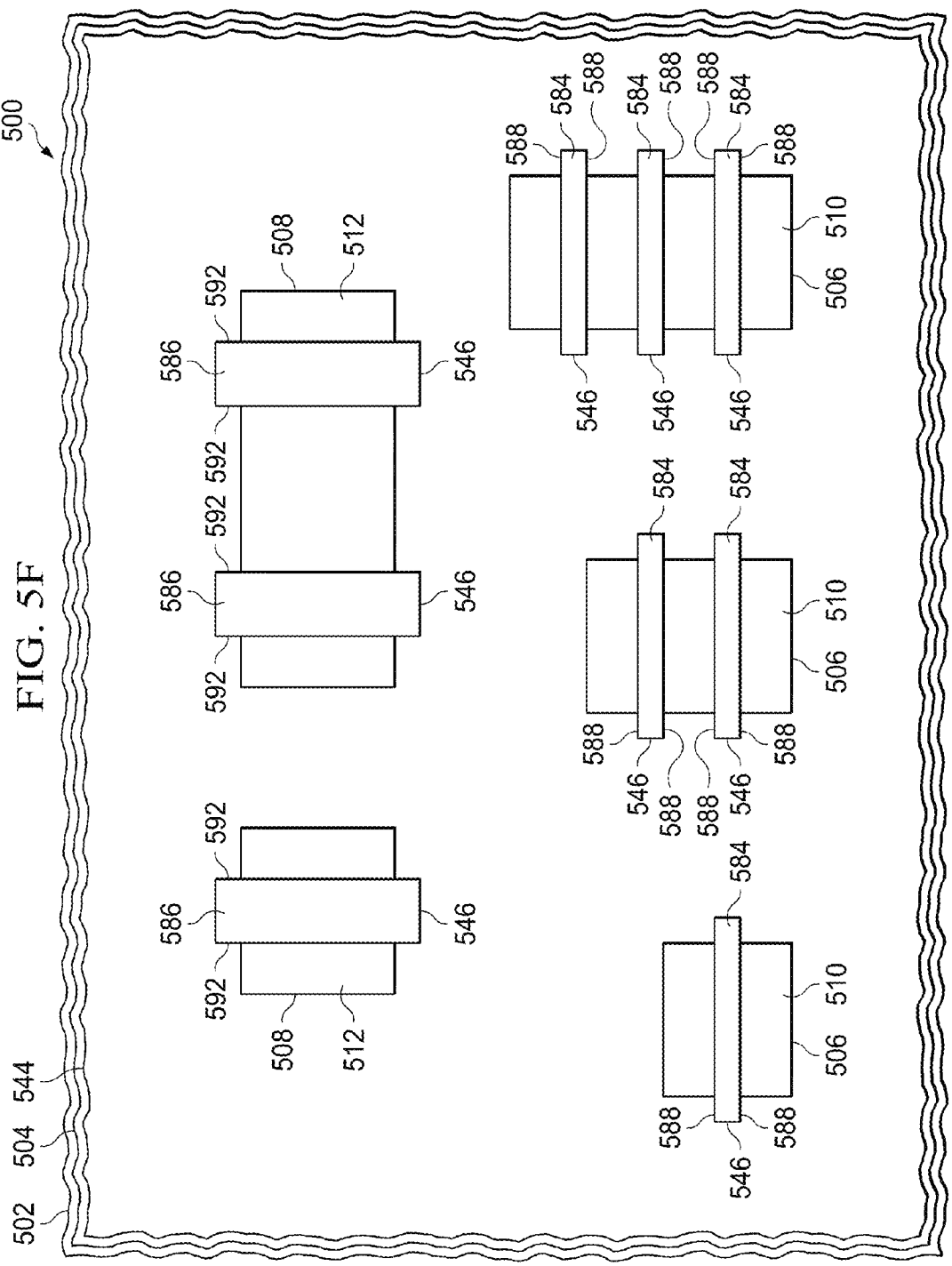

After the second gate hardmask etch process is completed, the etched gate hardmask layer 546 defines areas for a subsequent gate etch process, as shown in FIG. 5F. The bottom layer of polysilicon 544 of the gate layer stack 514 extends across the integrated circuit 500. The etched gate hardmask layer 546 includes core gate mask portions 584 and I/O gate mask portions 586. The core gate mask portions 584 have edges 588 which were defined by the gate pattern photolithography operation and which in turn define gate lengths of the core transistors. The I/O gate mask portions 586 have edges 592 which were defined by the gate trim photolithography operation and which in turn define gate lengths of the I/O transistors.

Figure 5G:
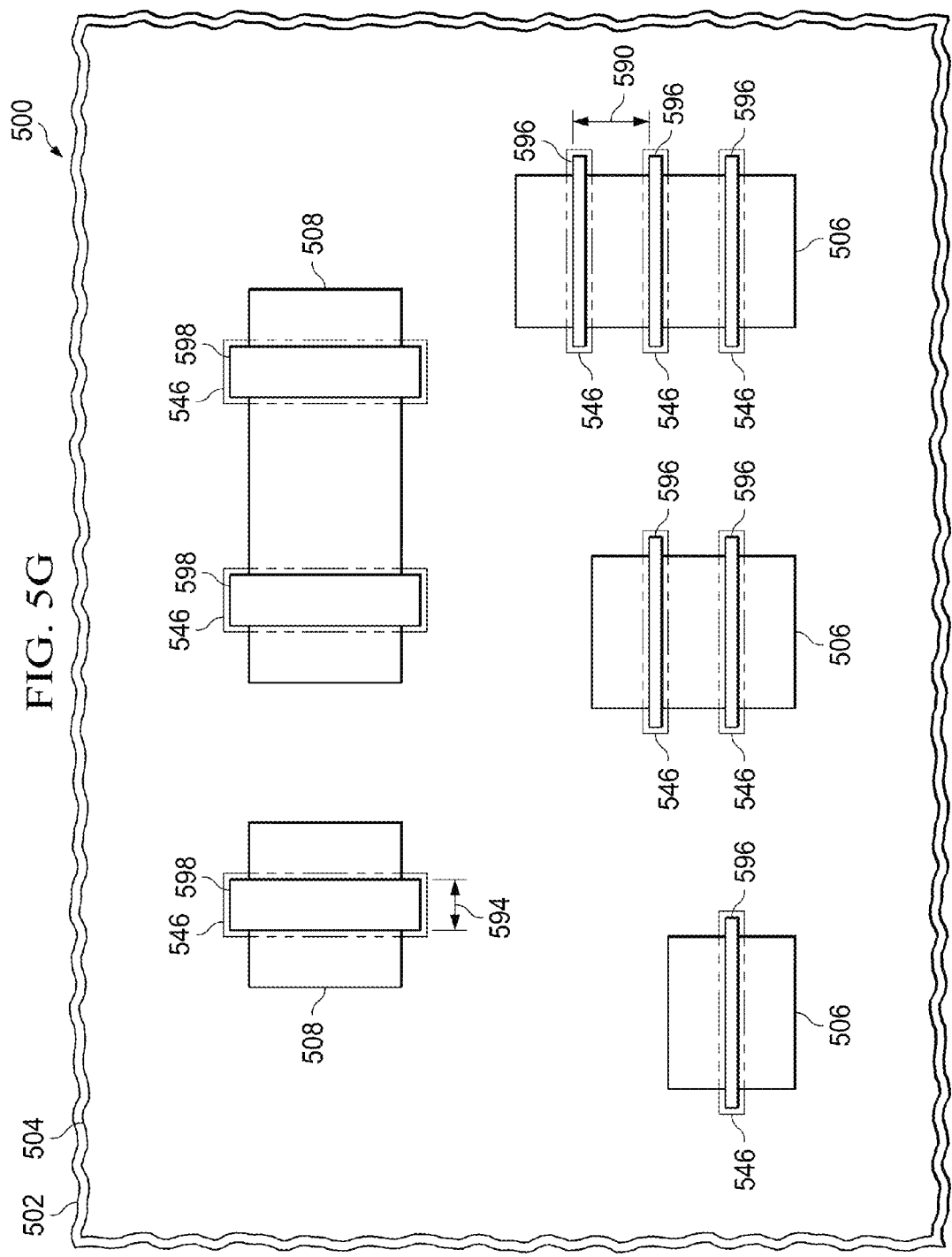

Referring to FIG. 5G, a gate etch operation is performed which removes polysilicon from the bottom layer of polysilicon 544 of the gate layer stack 514 outside the etched gate hardmask layer 546 to form core gates 596 and I/O gates 598. The etched gate hardmask layer 546 of FIG. 5F is depicted in FIG. 5G in outline. The gate etch operation may include one or more steps using a reactive ion etch (RIE) process which provides fluorine radicals to remove the polysilicon. The gate etch operation may undercut the etched gate hardmask layer 546 so that final lateral dimensions of the core gates 596 and I/O gates 598 are less than lateral dimensions of the etched gate hardmask layer 546, as depicted in FIG. 5G. The core gate dielectric layer 510 and the I/O gate dielectric layer 512 may be removed by the gate etch operation outside the core gates 596 and the I/O gates 598. In a version of the instant example in which the gate pattern photolithography operation and the gate trim photolithography operation use a 193 nanometer illumination source, a line/space pitch distance 590 of the core gates 596 may be 78 to 86 nanometers, and a linewidth 594 of the I/O gates 598 may be 110 to 130 nanometers. In a further version, the linewidth 594 of the I/O gates 598 may be 78 to 82 nanometers.

Figure 5J:
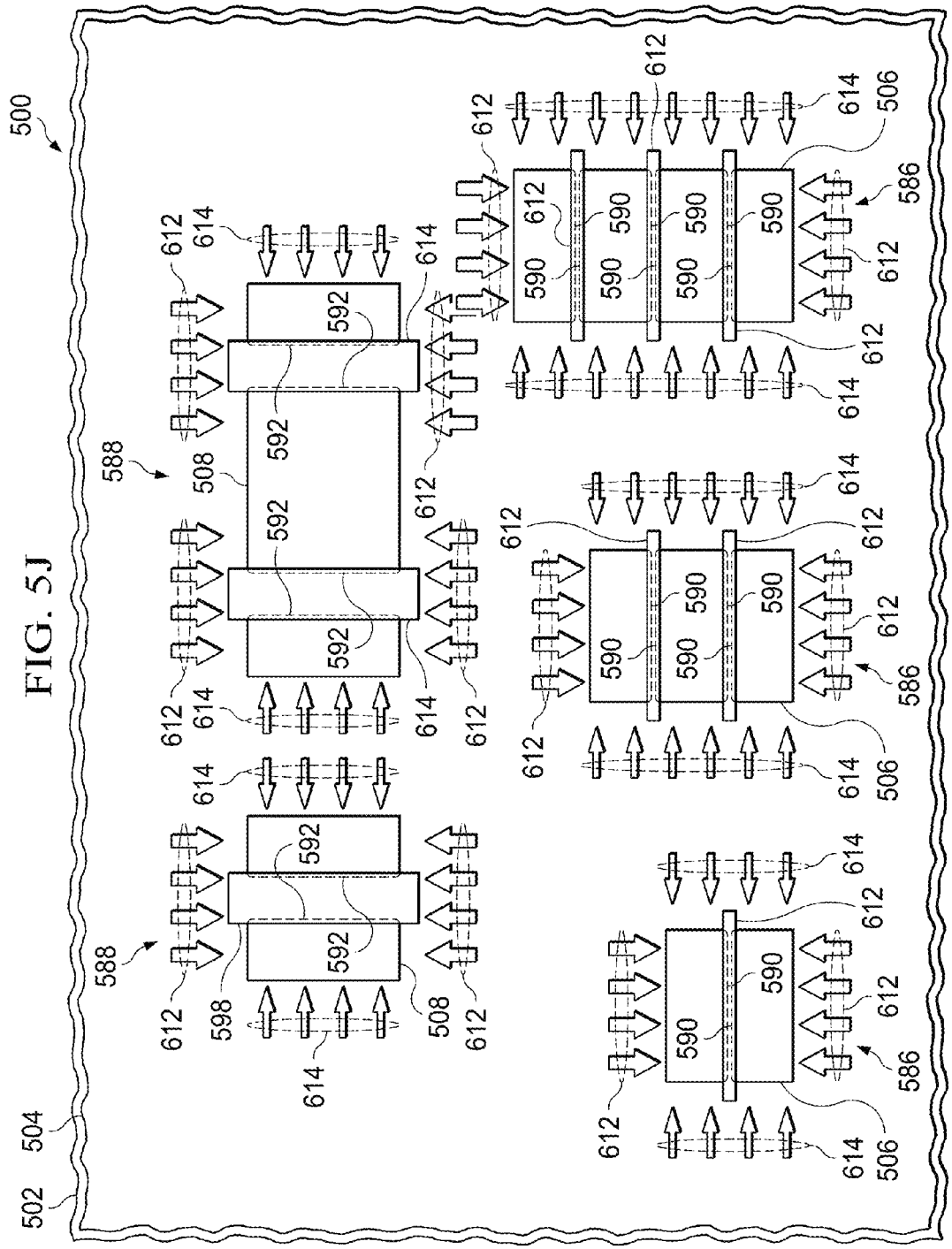

FIG. 5H through FIG. 5J depict alternative halo implant operations for the integrated circuit 500. Referring to FIG. 5H, a first halo implant operation includes a core transistor halo implant process having two angled implant steps 600 aligned perpendicular to the core gates 596 over the core active areas 506. The core transistors 602 and possibly the I/O transistors 604 are exposed to the angled implant steps 600. Exposing the I/O transistors 604 to the angled implant steps 600 may allow a single implant mask to be used for lightly doped drain (LDD) implants in both the core transistors 602 and the I/O transistors 604, advantageously reducing fabrication cost and complexity of the integrated circuit 500. The two angled implants 600 form core halo implanted regions 606 in the substrate 502 extending a short distance under the core gates 596. In the first halo operation, no angled halo implants are aligned perpendicular to the I/O gates 598 over the I/O active areas 508. The first halo operation does not form I/O halo implanted regions under the I/O gates 598, so that a desired on-state current in the I/O transistors 604 may be attained.

Referring to FIG. 5I, a second halo implant operation includes a combined core and I/O transistor halo implant process having four angled implant steps 610 with equal doses. Two angled implant steps 610 of the four angled implant steps 610 are aligned perpendicular to the core gates 596 over the core active areas 506, and two angled implant steps 610 of the four angled implant steps 610 are aligned perpendicular to the I/O gates 598 over the I/O active areas 508. The core transistors 602 and the I/O transistors 604 are exposed to the four angled implant steps 610, allowing a single implant mask to be used for LDD implants in both the core transistors 602 and the I/O transistors 604, advantageously reducing fabrication cost and complexity of the integrated circuit 500. The two angled implant steps 610 aligned perpendicular to the core gates 596 form core halo implanted regions 606 in the substrate 502 extending a short distance under the core gates 596, and the two angled implant steps 610 aligned perpendicular to the I/O gates 598 form I/O halo implanted regions 608 in the substrate 502 extending a short distance under the I/O gates 598. Forming the I/O halo implanted regions 608 extending under the I/O gates 598 may provide an off-state leakage current below a desired limit in the I/O transistors 604.

Referring to FIG. 5J, a third halo implant operation includes a combined core and I/O transistor halo implant process having four angled implant steps with unequal doses. Two high dose angled implant steps 612 of the four angled implant steps are aligned perpendicular to the core gates 596 over the core active areas 506, and two low dose angled implant steps 614 of the four angled implant steps are aligned perpendicular to the I/O gates 598 over the I/O active areas 508. In one version of the instant example, a dose of the two low dose angled implant steps may be less than half a dose of the two high dose angled implant steps. The core transistors 602 and the I/O transistors 604 are exposed to the high dose angled implant steps 612 and the low dose angled implant steps 614, allowing a single implant mask to be used for LDD implants in both the core transistors 602 and the I/O transistors 604, advantageously reducing fabrication cost and complexity of the integrated circuit 500. The two high dose angled implants 612 form core halo implanted regions 606 in the substrate 502 extending a short distance under the core gates 596, and the two low dose angled implants 614 form I/O halo implanted regions 608 in the substrate 502 extending a short distance under the I/O gates 598. Forming the I/O halo implanted regions 608 extending under the I/O gates 598 with a lower dose than the core halo implants 612 may provide a desired balance between on-state current and off-state leakage current in the I/O transistors 604.

Figure 9A:
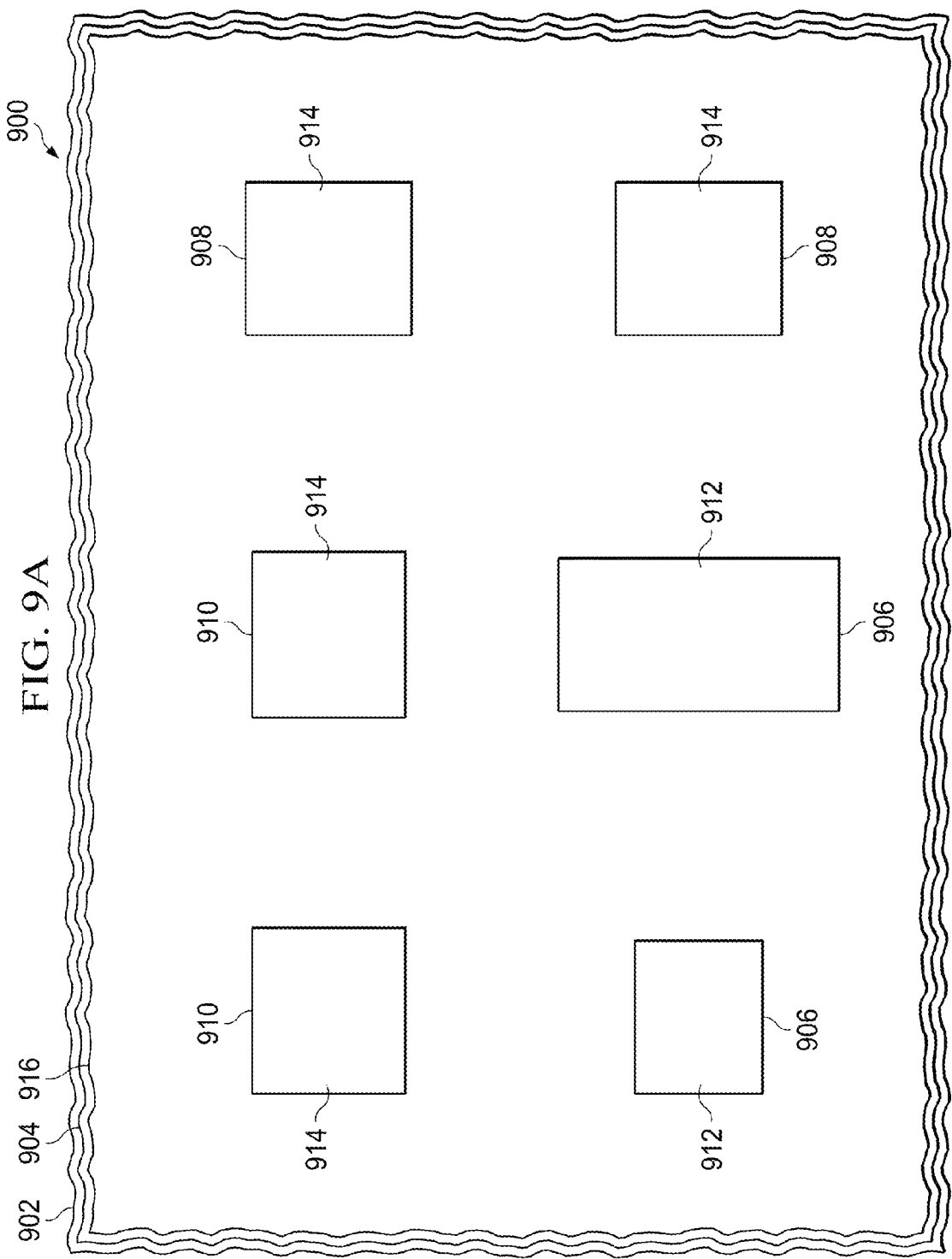

FIG. 9A through FIG. 9G are top views of an integrated circuit with core MOS transistors oriented in one direction, a first plurality of I/O MOS transistors oriented parallel to the core transistors and a second plurality of I/O MOS transistors oriented perpendicular to the core transistors, formed according to an example, depicted in successive stages of fabrication. Referring to FIG. 9A, the integrated circuit 900 is formed in and on a semiconductor substrate 902, and a layer of field oxide 904 is formed at a top surface of the substrate 902, as described in reference to FIG. 5A. A first plurality of openings 906 in the field oxide 904 provide core active areas 906 for the core transistors, a second plurality of openings 908 provide a first plurality of I/O active areas 908 for the first plurality of I/O transistors oriented parallel to the core transistors, and a third plurality of openings 910 provide a second plurality of I/O active areas 910 for the second plurality of I/O transistors oriented perpendicular to the core transistors. A core gate dielectric layer 912 is formed at a top surface of the substrate 902 in the core active areas 906, and an I/O gate dielectric layer 914 is formed at the top surface of the substrate 902 in the first plurality of I/O active areas 908 and in the second plurality of I/O active areas 910. The I/O gate dielectric layer 914 may be formed concurrently with, and be a same thickness as, the core gate dielectric layer 912, or may be thicker than the core gate dielectric layer 912, as described in reference to FIG. 5A.

A gate layer stack 916 is formed over the field oxide 904, the core gate dielectric layer 912 and the I/O gate dielectric layer 914. The gate layer stack 916 includes a bottom layer of polysilicon and a gate hardmask layer over the polysilicon layer, as described in reference to FIG. 5A. Features such as the core active areas 906, the first plurality of I/O active areas 908 and the second plurality of I/O active areas 910 under the gate layer stack 916 are depicted with solid lines to improve clarity of the Figures.

Figure 9B:
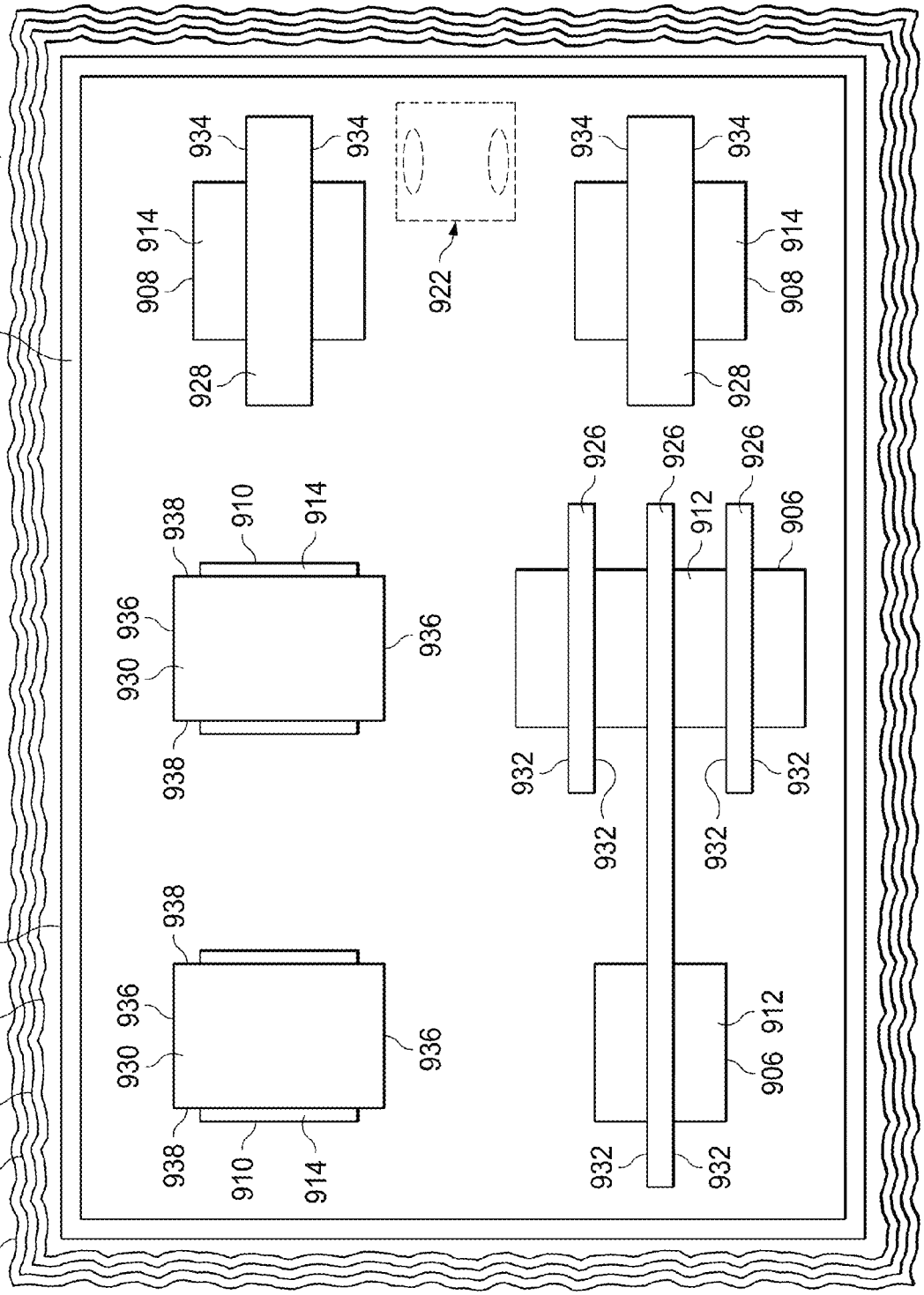

Referring to FIG. 9B, a gate etch pattern stack 918 is formed over the gate layer stack 916 as described in reference to FIG. 5B. Features such as the core active areas 906, the first plurality of I/O active areas 908 and the second plurality of I/O active areas 910 under the gate etch pattern stack 918 are depicted with solid lines to improve clarity of the Figures. A gate pattern photolithography operation is performed which uses an illumination source with a strong dipole component, for example as described and oriented in FIG. 1 and oriented as depicted by example illumination source 922 and a gate pattern photomask 924, with dark geometries, to expose the gate etch pattern stack 918 outside of areas for gates of the core transistors and I/O transistors, as described in reference to FIG. 5B. The gate pattern photomask 924 includes core gate geometries 926 in areas defined for gates of the core transistors, first I/O gate geometries 928 in areas defined for gates of the first plurality of I/O transistors oriented parallel to the core transistors, and second I/O gate geometries 930 in areas defined for gates of the second plurality of I/O transistors oriented perpendicular to the core transistors.

The core gate geometries 926 are oriented with the strong dipole component of the illumination source as described in reference to FIG. 2, so that edges 932 of the core gate geometries 926 define gate lengths of the core transistors. Similarly, edges 934 of the first I/O gate geometries 928 define gate lengths of the first plurality of I/O transistors. Ends 936 of the second I/O gate geometries 930 define ends of the second plurality of I/O transistors. Edges 938 of the second I/O gate geometries 930 are oversized for the second plurality of I/O transistors, for example by 20 nanometers. The gate pattern photomask 924 may further include an optional border 940.

Figure 9C:
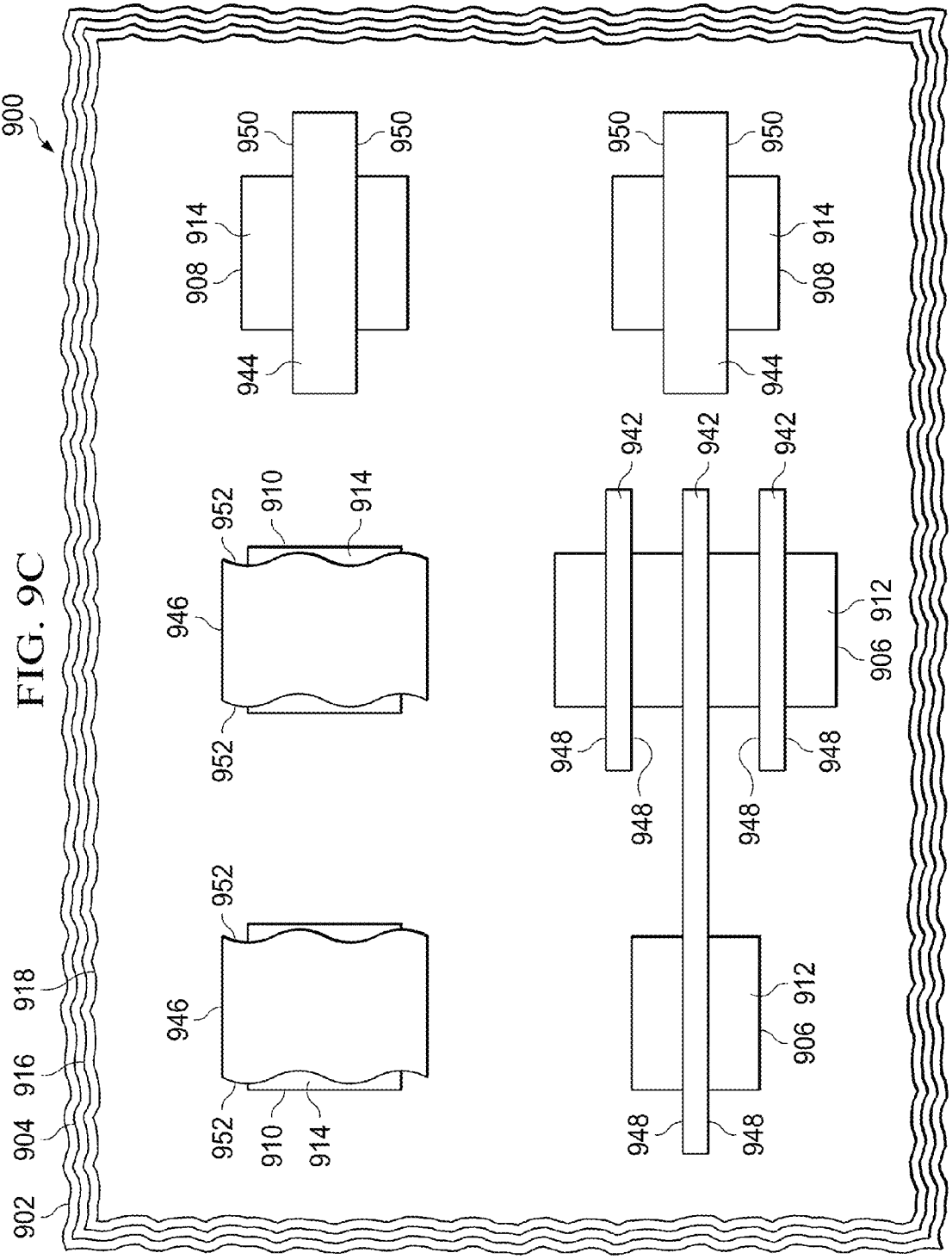

Referring to FIG. 9C, a positive tone develop operation is performed which leaves photoresist of the gate etch pattern stack 918 in areas defined by the dark geometries of the gate pattern photomask 924. The developed photoresist areas of the gate etch pattern stack 918 include core pattern portions 942 over the core active areas 906. The core pattern portions 942 have edges 948 which define gate lengths of the core transistors. The developed photoresist areas of the gate etch pattern stack 918 also include first I/O pattern portions 944 over the first plurality of I/O active areas 908. The first I/O pattern portions 944 have edges 950 which define gate lengths of the first I/O transistors. The developed photoresist areas of the gate etch pattern stack 918 further include second I/O pattern portions 946 over the first plurality of I/O active areas 908. The second I/O pattern portions 946 have edges 952 which may exhibit undesired wavy contours as depicted in FIG. 9C as a result of "ringing" during exposure with the gate pattern strong dipole illumination source.

A first gate hardmask etch process, as described in reference to FIG. 7A through FIG. 7D, is performed which transfers the pattern of the developed photoresist areas of the gate etch pattern stack 918 to the gate hardmask layer of the gate layer stack 916.

Figure 9D:
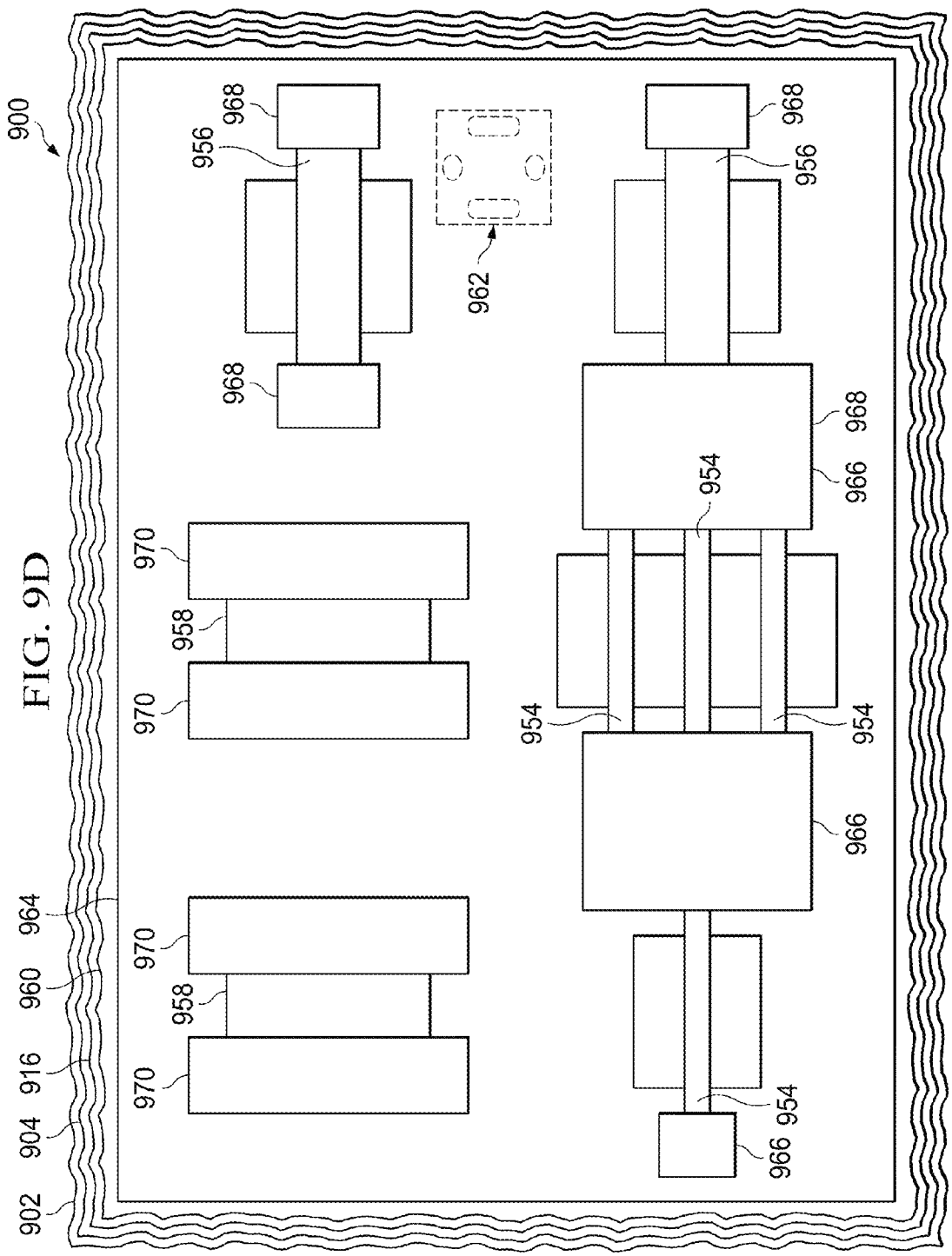

Referring to FIG. 9D, core transistor portions 954, first I/O transistor portions 956 and second I/O transistor portions 958 of the gate hardmask layer of the gate layer stack 916 are depicted with a coarse stipple pattern. A tri-layer gate trim pattern stack 960 is formed over the gate layer stack 916, as described in reference to FIG. 5D. A gate trim photolithography operation is performed which uses an illumination source with a moderate dipole component, for example as described in reference to FIG. 3 and oriented as depicted by example illumination source 962, or possibly an isotropic illumination source. The gate trim photolithography operation uses a dark geometry second gate trim photomask 964 which has dark geometries, to expose the gate trim pattern stack 960 so as to define edges of the second I/O transistor gates which were oversized by the gate pattern photolithography operation. The dark geometries of the gate trim photomask 964 include dark core end trim areas 966, dark first I/O end trim areas 968 and dark second I/O gate edge trim areas 970. The gate trim photolithography operation exposes the gate trim pattern stack 960. A negative tone develop operation is performed which removes the top layer of photoresist in the gate trim pattern stack 960 from the areas exposed by the gate trim photolithography operation, that is areas outside the dark geometries of the dark geometry gate trim photomask 964.

Developed photoresist 972 from the gate trim photolithography operation is depicted in FIG. 9E with a light stipple pattern. Open areas in the developed photoresist 972 include core end trim areas 974 exposing the core transistor portions 554 of the gate hardmask layer of the gate layer stack 916, first I/O end trim areas 976 exposing the first I/O transistor portions 956 of the gate hardmask layer, and second I/O gate edge trim areas 978 exposing the second I/O transistor portions 958 of the gate hardmask layer. A second gate hardmask etch process is performed which transfers the pattern of the developed photoresist 972 of the gate trim pattern stack 960 to the gate hardmask layer of the gate layer stack 916, as described in reference to FIG. 8A through FIG. 8D.

Figure 9F:
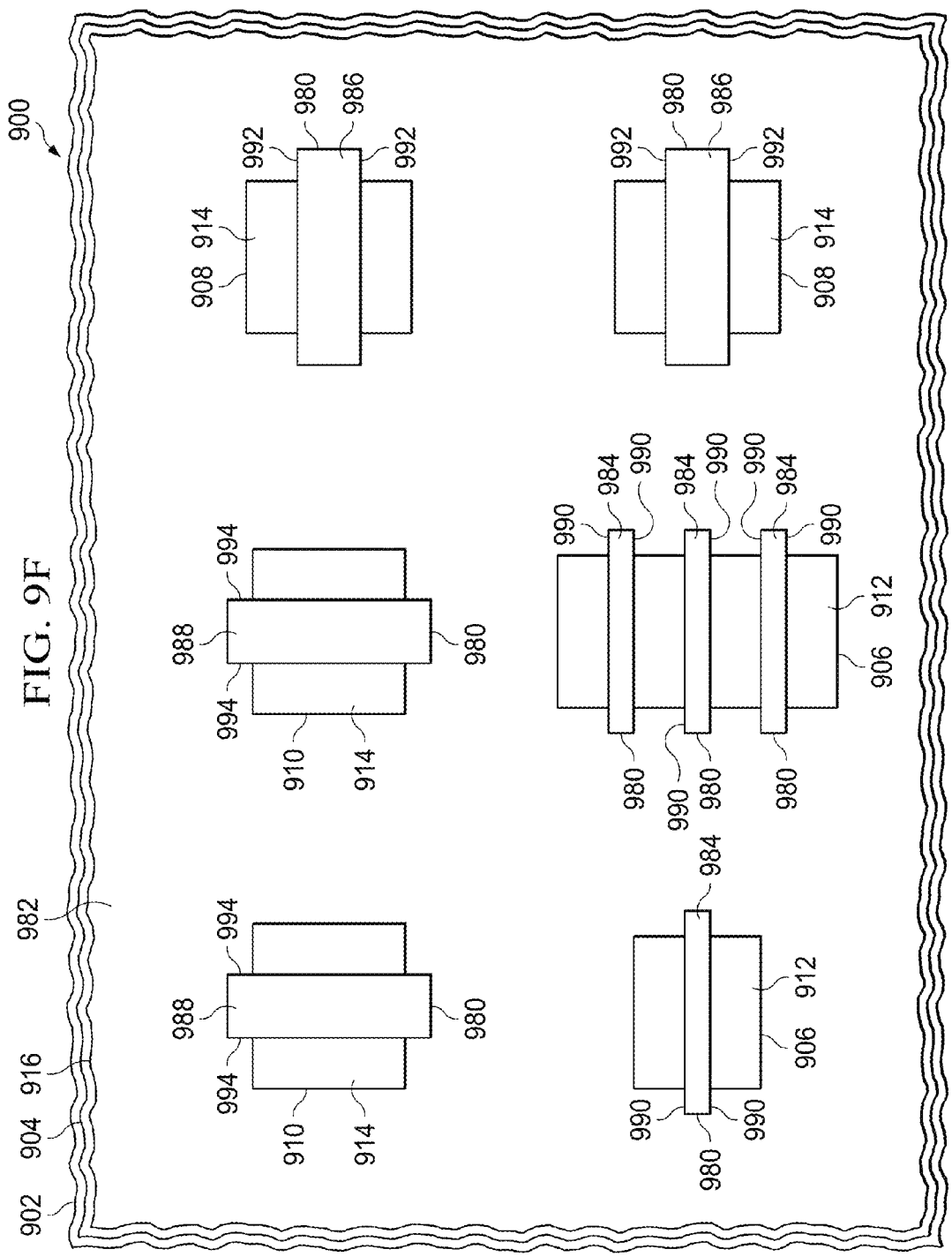

After the second gate hardmask etch process is completed, the etched gate hardmask layer 980 of the gate layer stack 916 defines areas for a subsequent gate etch process, as shown in FIG. 9F. The bottom layer of polysilicon 982 of the gate layer stack 916 extends across the integrated circuit 900. The etched gate hardmask layer 980 includes core hardmask portions 984, first I/O hardmask portions 986 and second I/O hardmask portions 988. The core hardmask portions 984 have edges 990 which were defined by the gate pattern photolithography operation and which in turn define gate lengths of the core transistors. The first I/O hardmask portions 986 have edges 992 which were defined by the gate pattern photolithography operation and which in turn define gate lengths of the first I/O transistors. The second I/O hardmask portions 988 have edges 994 which were defined by the gate trim photolithography operation and which in turn define gate lengths of the second I/O transistors.

Figure 9G:
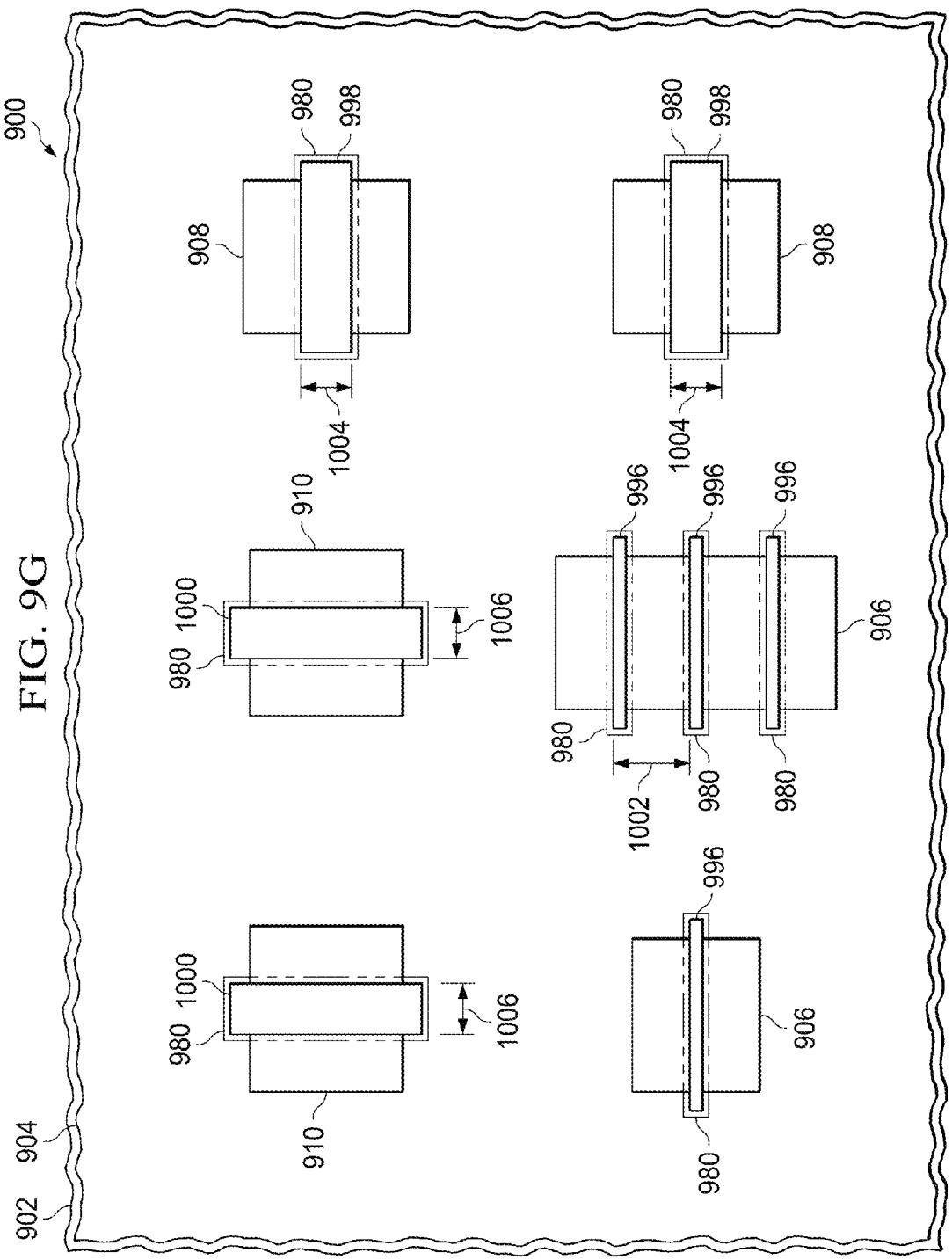

Referring to FIG. 9G, a gate etch operation as described in reference to FIG. 5G is performed which removes polysilicon from the bottom layer of polysilicon 982 of the gate layer stack 916 outside the etched gate hardmask layer 980 of FIG. 9F to form core gates 996, first I/O gates 998 and second I/O gates 1000. The etched gate hardmask layer 980 is depicted in FIG. 9G in outline. The gate etch operation may undercut the etched gate hardmask layer 980 so that final lateral dimensions of the core gates 996, first I/O gates 998 and second I/O gates 1000 are less than lateral dimensions of the etched gate hardmask layer 980, as depicted in FIG. 9G. The core gate dielectric layer 912 and the I/O gate dielectric layer 914 may be removed by the gate etch operation outside the core gates 996, first I/O gates 998 and second I/O gates 1000. In a version of the instant example in which the gate pattern photolithography operation and the gate trim photolithography operation use a 193 nanometer illumination source, a line/space pitch distance 1002 of the core gates 996 may be 78 to 86 nanometers, and a linewidth 1004 of the first I/O gates 998 and a linewidth 1006 of the second I/O gates 1000 may be 110 to 130 nanometers. In a further version, the linewidth 1004 of the first I/O gates 998 and the linewidth 1006 of the second I/O gates 1000 may be 78 to 82 nanometers.

Figure 9H:
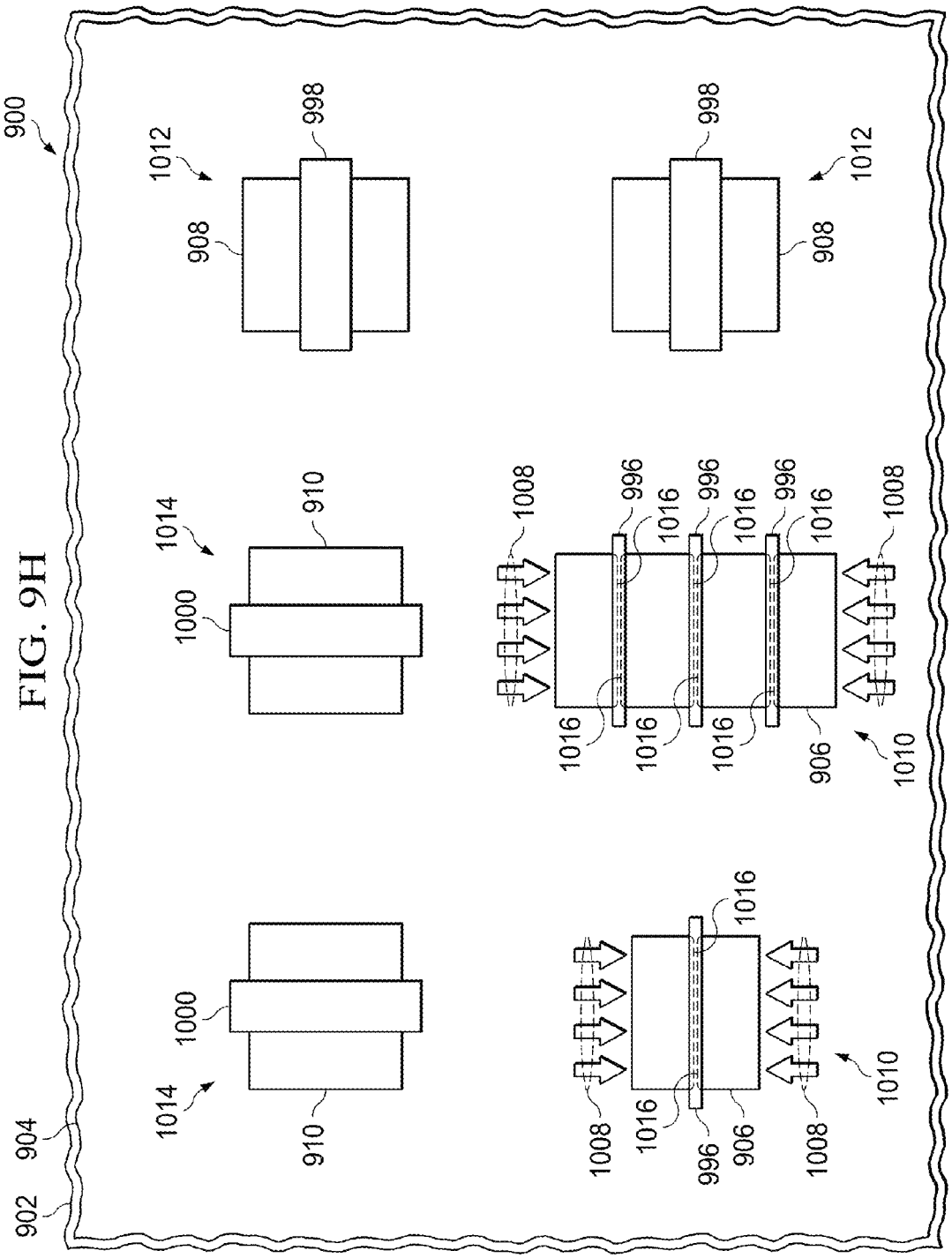

FIG. 9H through FIG. 9K depict alternative halo implant operations for the integrated circuit 900. Referring to FIG. 9H, a first halo implant operation includes a core transistor halo implant process having two angled implant steps 1008 aligned perpendicular to the core gates 996 over the core active areas 906. The core transistors 1010 are exposed to the angled implant steps 1008, while the first I/O transistors 1012 and the second I/O transistors 1014 are blocked from the angled implant steps 1008, for example by an implant mask of photoresist. The two angled implants 1008 form core halo implanted regions 1016 in the substrate 902 extending a short distance under the core gates 996. Exposing core transistors 1010 to the angled implant steps 1008 may limit an off-state current of the core transistors 1010 to a desired value. In the first halo operation, no angled halo implants are aligned perpendicular to the first I/O gates 998 over the first plurality of I/O active areas 908 or to the second I/O gates 1000 over the second plurality of I/O active areas 910. The first halo operation does not form halo implanted regions under the first I/O gates 998 or the second I/O gates 1000, which may provide a desired on-state current in the first I/O transistors 1012 and the second I/O transistors 1014.

Referring to FIG. 9I, a second halo implant operation includes a combined core and I/O transistor halo implant process having four angled implant steps 1020 with equal doses. Two angled implant steps 1020 of the four angled implant steps 1020 are aligned perpendicular to the core gates 996 over the core active areas 906 and perpendicular to the first I/O gates 998 over the first plurality of I/O active areas 908, and the remaining two angled implant steps 1020 of the four angled implant steps 1020 are aligned perpendicular to the second I/O gates 1000 over the second plurality of I/O active areas 910. The core transistors 1010, the first I/O transistors 1012 and the second I/O transistors 1014 are exposed to the angled implant steps 1020, allowing a single implant mask to be used for LDD implants in both the core transistors 1010, the first I/O transistors 1012 and the second I/O transistors 1014, advantageously reducing fabrication cost and complexity of the integrated circuit 900. The two angled implants 1020 aligned perpendicular to the core gates 996 and the first I/O gates 998 form core halo implanted regions 1016 in the substrate 902 extending a short distance under the core gates 996 and I/O halo implanted regions 1018 extending a short distance under the first I/O gates 998, respectively. The two angled implants 1020 aligned perpendicular to the second I/O gates 1000 form additional instances of the I/O halo implanted regions 1018 in the substrate 902 extending a short distance under the second I/O gates 1000. Forming the I/O halo implanted regions 1018 extending under the first I/O gates 998 and the second I/O gates 1000 may provide an off-state leakage current below a desired limit in the first I/O transistors 1012 and the second I/O transistors 1014.

Figure 9J:
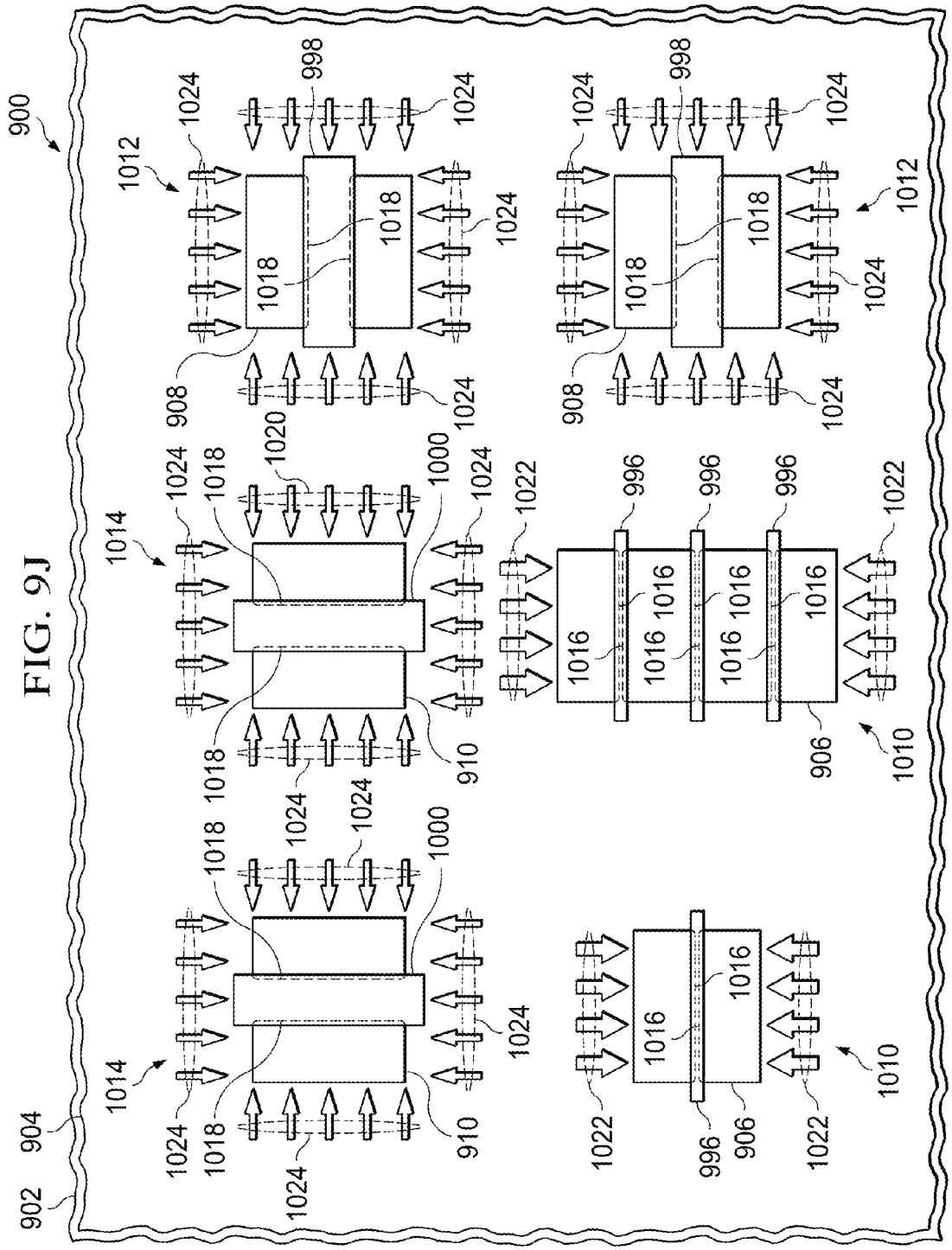

Referring to FIG. 9J, a third halo implant operation includes separate core and I/O transistor halo implant process having two angled implant steps 1022 with a core dose for the core transistors 1010 and four angled implant steps 1024 with an I/O dose for the first I/O transistors 1012 and the second I/O transistors 1014. In one version of the instant example, the I/O dose may be less than half of the core dose. The first I/O transistors 1012 and the second I/O transistors 1014 are blocked from the two angled implant steps 1022 with the core dose, for example by an implant mask. The two core dose angled implants 1022 form core halo implanted regions 1016 in the substrate 902 extending a short distance under the core gates 996. The two I/O dose angled implants 1024 aligned perpendicular to the first I/O gates form I/O halo implanted regions 1018 in the substrate 902 extending a short distance under the first I/O gates 998, and the two I/O dose angled implants 1024 aligned perpendicular to the second I/O gates 1000 form additional instances of the I/O halo implanted regions 1018 in the substrate 902 extending a short distance under the second I/O gates 1000. Forming the halo implanted regions 1018 extending under the first I/O gates 998 and the second I/O gates 1000 with a separate dose from the core halo implants 1022 may provide a desired balance between on-state current and off-state leakage current in the first I/O transistors 1012 and the second I/O transistors 1014.

Figure 9K:
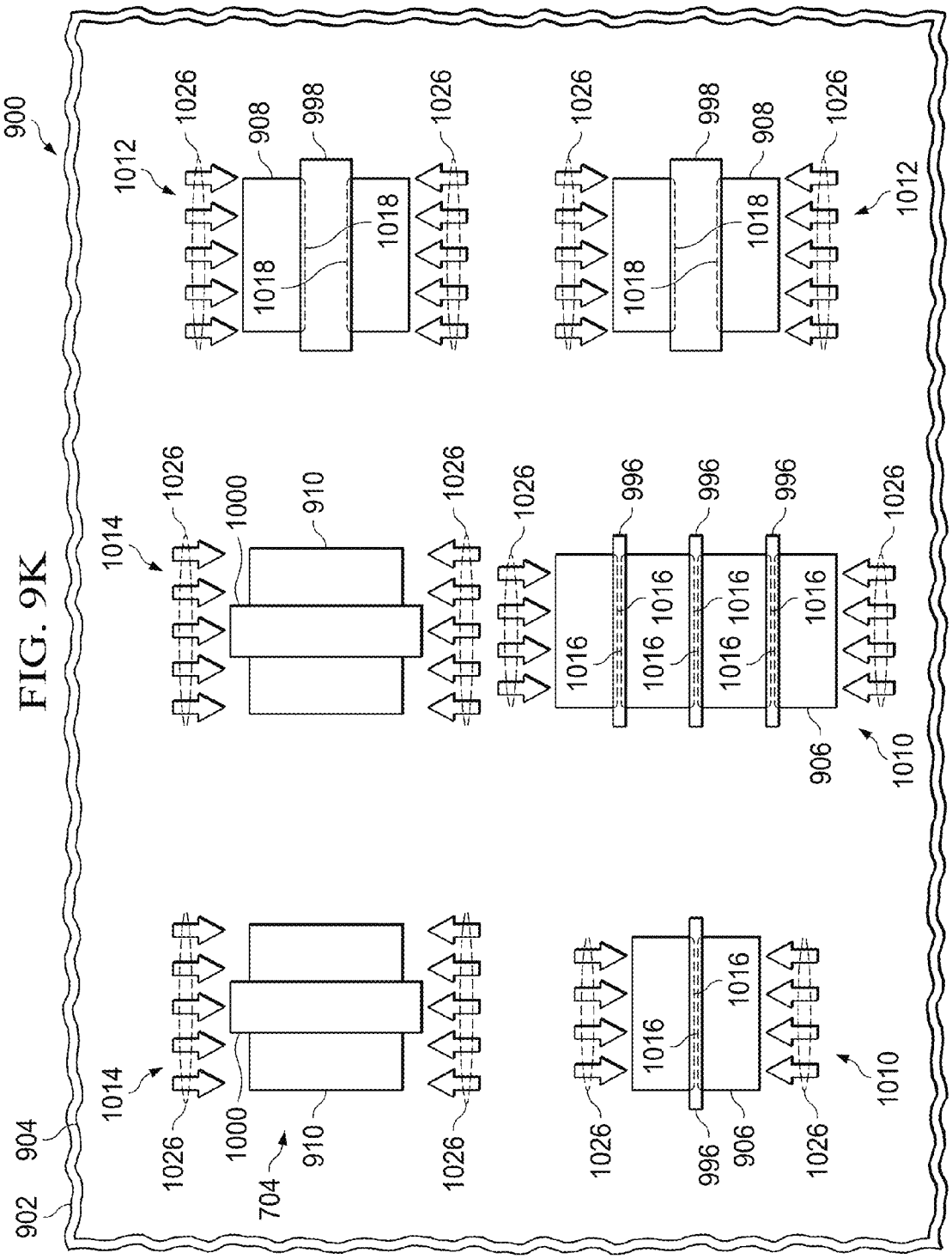

Referring to FIG. 9K, a fourth halo implant operation includes a core transistor halo implant process having two angled implant steps 1026 aligned perpendicular to the core gates 996 over the core active areas 906 and the first I/O gates 998 over the first I/I active areas 908. The core transistors 1010, the first I/O transistors 1012 and the second I/O transistors 1014 and are exposed to the angled implant steps 1026. The two angled implants 1026 form core halo implanted regions 1016 in the substrate 902 extending a short distance under the core gates 996 and I/O halo implanted regions 1018 extending a short distance under the first I/O gates 998, respectively. In the fourth halo operation, no angled halo implants are aligned perpendicular to the second I/O gates 1000 over the second plurality of I/O active areas 910, so that the fourth halo operation does not form I/O halo implanted regions under the second I/O gates 1000. Forming the I/O halo implanted regions 1018 extending under the first I/O gates 998 may provide an off-state leakage current below a desired limit in the first I/O transistors 1012, while forming the second I/O transistors 1014 having no I/O halo implanted regions may provide a desired on-state current in the second I/O transistors 1014. Exposing the second I/O transistors 1014 to the angled implant steps 1026 may allow a single implant mask to be used for LDD implants in the core transistors 1010, the first I/O transistors 1012 and the second I/O transistors 1014, advantageously reducing fabrication cost and complexity of the integrated circuit 900.

While various examples of the present invention have been described above, it should be understood that they have been presented by way of example only and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

What is claimed is:

1. A method of forming an integrated circuit, comprising the steps of:
   providing a substrate comprising a semiconductor;
   forming a core gate dielectric layer at the top surface of the substrate in core active areas for core transistors;
   forming an input/output (I/O) gate dielectric layer at the top surface of the substrate in the I/O active areas for I/O transistors oriented perpendicular to the core transistors;
   forming a gate layer stack over the substrate, the gate layer stack including a bottom layer of polysilicon and a gate hardmask layer over the layer of polysilicon;
   forming a gate etch pattern stack including positive-developing photoresist over the gate layer;
   exposing the gate etch pattern stack using an illumination source with a strong dipole component and a dark geometry gate pattern photomask including core gate geometries for gates of the core transistors and I/O gate geometries perpendicular to the core gate geometries for gates of the I/O transistors, so that:
      edges defining gate lengths of the core transistors are aligned with the strong dipole component of the illumination source;
      ends of the I/O gate geometries define ends the gates of the I/O transistors; and
      edges of the I/O gate geometries perpendicular to the gate pattern dipole component are oversized;
   performing a positive tone develop operation of the exposed photoresist of the gate etch pattern stack;
   removing the gate hardmask layer in areas defined by the gate etch pattern stack;
   forming a gate trim pattern stack over the gate layer stack, the gate trim pattern stack including a layer of photoresist;
   exposing the photoresist layer of the gate trim pattern stack through a gate trim photomask having geometries including core end trim areas and I/O gate edge trim areas, so that:
      the core end trim areas of the gate trim photomask define ends of the gates of the core transistors; and
      the I/O gate edge trim areas of the gate trim photomask define gate lengths of the I/O transistors;
   performing a develop operation of the exposed photoresist of the gate trim pattern stack;
   removing the gate hardmask layer in areas defined by the gate trim pattern stack; and
   removing polysilicon from the bottom layer of polysilicon of the gate layer stack outside the etched gate hardmask layer, so as to form the gates of the core transistors and the gates of the I/O transistors.

2. The method of claim 1, wherein the I/O gate dielectric layer is formed concurrently with the core gate dielectric layer and a thickness of the I/O gate dielectric layer is substantially equal to a thickness of the core gate dielectric layer.

3. The method of claim 1, wherein a thickness of the I/O gate dielectric layer is at least 1½ times a thickness of the core gate dielectric layer.

4. The method of claim 1, further including performing a halo implant operation having two angled implant steps aligned perpendicular to the core gates over the core active areas, such that:
   the core transistors and the I/O transistors are exposed to the angled implant steps;
   the two angled implants form core halo implanted regions in the substrate extending a short distance under the core gates; and
   the substrate is free of halo implanted regions under the I/O gates after the halo implant operation is performed.

5. The method of claim 1, further including performing a halo implant operation having four angled implant steps with equal doses, wherein:
   the core transistors and the I/O transistors are exposed to the four angled implant steps;
   two angled implant steps of the four angled implant steps are aligned perpendicular to the core gates over the core active areas;
   two angled implant steps of the four angled implant steps are aligned perpendicular to the I/O gates over the I/O active areas;
   the two angled implants aligned perpendicular to the core gates form core halo implanted regions in the substrate extending a short distance under the core gates; and
   the two angled implants aligned perpendicular to the I/O gates form I/O halo implanted regions in the substrate extending a short distance under the I/O gates.

6. The method of claim 1, further including performing a halo implant operation having four angled implant steps with unequal doses, wherein:
   the core transistors and the I/O transistors are exposed to the four angled implant steps;
   two high dose angled implant steps of the four angled implant steps are aligned perpendicular to the core gates over the core active areas;
   two low dose angled implant steps of the four angled implant steps are aligned perpendicular to the I/O gates over the I/O active areas;
   the two high dose angled implants aligned perpendicular to the core gates form core halo implanted regions in the substrate extending a short distance under the core gates; and
   the two low dose angled implants aligned perpendicular to the I/O gates form I/O halo implanted regions in the substrate extending a short distance under the I/O gates.

7. The method of claim 6, wherein a dose of the two low dose angled implants is less than half a dose of the two high dose angled implants.

8. The method of claim 1, wherein:
the gate pattern photolithography operation uses a 193 nanometer illumination source;
the gate trim photolithography operation uses a 193 nanometer illumination source;
a line/space pitch distance of the core gates is 78 to 86 nanometers; and
a linewidth of the I/O gates is 110 to 130 nanometers.

9. The method of claim 1, wherein:
the gate pattern photolithography operation uses a 193 nanometer illumination source;
the gate trim photolithography operation uses a 193 nanometer illumination source;
a line/space pitch distance of the core gates is 78 to 86 nanometers; and
a linewidth of the I/O gates is 78 to 82 nanometers.

10. A method of forming an integrated circuit, comprising the steps of:
providing a semiconductor substrate;
forming field oxide at a top surface of the substrate so that the field oxide has:
a first plurality of openings so as to provide core active areas for core transistors;
a second plurality of openings so as to provide a first plurality of I/O active areas for a first plurality of I/O transistors, the first plurality of I/O transistors being oriented parallel to the core transistors; and
a third plurality of openings so as to provide a second plurality of I/O active areas for a second plurality of I/O transistors, the second plurality of I/O transistors being oriented perpendicular to the core transistors;
forming a core gate dielectric layer at the top surface of the substrate in the core active areas;
forming an I/O gate dielectric layer at the top surface of the substrate in the first plurality of I/O active areas and in the second plurality of I/O active areas;
forming a gate layer stack over the field oxide, the core gate dielectric layer and the I/O gate dielectric layer, the gate layer stack including a bottom layer of polysilicon and a gate hardmask layer over the layer of polysilicon;
forming a gate etch pattern stack including positive-developing photoresist over the gate layer;
performing a gate pattern photolithography operation which uses an illumination source with a strong dipole component and a gate pattern photomask, the gate pattern photomask having dark geometries including core gate geometries in areas defined for gates of the core transistors, first I/O gate geometries in areas defined for gates of the first plurality of I/O transistors and second I/O gate geometries in areas defined for gates of the second plurality of I/O transistors, the gate pattern photolithography operation exposing the gate etch pattern stack outside of areas for gates of the core transistors, the first plurality of I/O transistors and the second plurality of I/O transistors, so that:
edges of the core gate geometries are aligned with the strong dipole component of the illumination source, the edges defining gate lengths of the core transistors;
edges of the first I/O gate geometries define gate lengths of the first plurality of I/O transistors;
ends of the second I/O gate geometries define ends of the gates of the second plurality of I/O transistors; and
edges of the second I/O gate geometries aligned perpendicular to the gate pattern dipole component are oversized from desired edges of the gates of the second plurality of I/O transistors;
performing a positive tone develop operation of the exposed photoresist of the gate etch pattern stack;
performing a first gate hardmask etch process which removes the gate hardmask layer under areas exposed by the developed photoresist of the gate etch pattern stack;
performing a gate trim photolithography operation which uses a gate trim photomask, the gate trim photomask having geometries including core end trim areas, first I/O gate end trim areas, and second I/O gate edge trim areas, the gate trim photolithography operation exposing the photoresist layer of the gate trim pattern stack through the gate trim photomask, so that:
the core end trim areas of the gate trim photomask define ends of the gates of the core transistors;
the first I/O end trim areas of the gate trim photomask define ends of the gates of the first plurality of I/O transistors; and
the second I/O gate edge trim areas of the gate trim photomask define gate lengths of the second plurality of I/O transistors;
performing a develop operation of the exposed photoresist of the gate trim pattern stack;
performing a second gate hardmask etch process which removes the gate hardmask layer under areas exposed by the developed photoresist of the gate trim pattern stack; and
performing a gate etch operation which removes polysilicon from the bottom layer of polysilicon of the gate layer stack outside the etched gate hardmask layer of the gate layer stack, so as to form the gates of the core transistors, the gates of the first plurality of I/O transistors and the gates of the second plurality of I/O transistors.

11. The method of claim 10, wherein the I/O gate dielectric layer is formed concurrently with the core gate dielectric layer and a thickness of the I/O gate dielectric layer is substantially equal to a thickness of the core gate dielectric layer.

12. The method of claim 10, wherein a thickness of the I/O gate dielectric layer is at least 1½ times a thickness of the core gate dielectric layer.

13. The method of claim 10, further including performing a halo implant operation having two angled implant steps aligned perpendicular to the core gates over the core active areas, such that:
the core transistors are exposed to the angled implant steps;
the first plurality of I/O transistors and the second plurality of I/O transistors are blocked from the angled implant steps;
the two angled implants form core halo implanted regions in the substrate extending a short distance under the core gates; and
the substrate is free of halo implanted regions under the first I/O gates and under the second I/O gates after the halo implant operation is performed.

14. The method of claim 10, further including performing a halo implant operation having four angled implant steps with equal doses, wherein:
the core transistors, the first plurality of I/O transistors and the second plurality of I/O transistors are exposed to the four angled implant steps;
two angled implant steps of the four angled implant steps are aligned perpendicular to the core gates over the core active areas and perpendicular to the first I/O gates over the first plurality of I/O active areas;

two angled implant steps of the four angled implant steps are aligned perpendicular to the second I/O gates over the second plurality of I/O active areas;

the two angled implants aligned perpendicular to the core gates and the first I/O gates form core halo implanted regions in the substrate extending a short distance under the core gates and I/O halo implanted regions in the substrate extending a short distance under the first I/O gates; and the two angled implants aligned perpendicular to the second I/O gates form additional instances of the I/O halo implanted regions in the substrate extending a short distance under the second I/O gates.

15. The method of claim 10, further including performing a halo implant operation having separate core and I/O transistor halo implant process, the halo implant operation having two angled implant steps with a core dose for the core transistors and four angled implant steps with an I/O dose for the first plurality of I/O transistors and the second plurality of I/O transistors, wherein:

the core transistors are exposed to the two angled implant steps with the core dose;

the first plurality of I/O transistors and the second plurality of I/O transistors are blocked from the two angled implant steps with the core dose;

the two angled implant steps with the core dose are aligned perpendicular to the core gates;

the two angled implants aligned perpendicular to the core gates form core halo implanted regions in the substrate extending a short distance under the core gates;

the first plurality of I/O transistors and the second plurality of I/O transistors are exposed to the four angled implant steps with the I/O dose;

two angled implant steps of the four angled implant steps with the I/O dose are aligned perpendicular to the first I/O gates over the first plurality of I/O active areas;

the two angled implants with the I/O dose aligned perpendicular to the first I/O gates form I/O halo implanted regions in the substrate extending a short distance under the first I/O gates;

two angled implant steps of the four angled implant steps are aligned perpendicular to the I/O gates over the I/O active areas;

two angled implant steps of the four angled implant steps with the I/O dose are aligned perpendicular to the second I/O gates over the second plurality of I/O active areas; and the two angled implants with the I/O dose aligned perpendicular to the second I/O gates form additional instances of the I/O halo implanted regions in the substrate extending a short distance under the second I/O gates.

16. The method of claim 15, wherein a dose of the I/O dose is less than half of the core dose.

17. The method of claim 10, further including performing a halo implant operation having two angled implant steps aligned perpendicular to the core gates over the core active areas, such that:

the core transistors are exposed to the angled implant steps;

the first plurality of I/O transistors are exposed to the angled implant steps;

the two angled implants form core halo implanted regions in the substrate extending a short distance under the core gates;

the two angled implants form I/O halo implanted regions in the substrate extending a short distance under the first plurality of I/O gates; and the substrate is free of halo implanted regions under the second I/O gates after the halo implant operation is performed.

18. The method of claim 10, wherein:

the gate pattern photolithography operation uses a 193 nanometer illumination source;

the gate trim photolithography operation uses a 193 nanometer illumination source;

a line/space pitch distance of the core gates is 78 to 86 nanometers;

a linewidth of the first I/O gates is 110 to 130 nanometers; and a linewidth of the second I/O gates is 110 to 130 nanometers.

19. The method of claim 10, wherein:

the gate pattern photolithography operation uses a 193 nanometer illumination source;

the gate trim photolithography operation uses a 193 nanometer illumination source;

a line/space pitch distance of the core gates is 78 to 86 nanometers;

a linewidth of the first I/O gates is 78 to 82 nanometers; and a linewidth of the second I/O gates is 78 to 82 nanometers.

* * * * *